United States Patent
Wakisaka et al.

(10) Patent No.: US 7,368,813 B2
(45) Date of Patent: May 6, 2008

(54) SEMICONDUCTOR DEVICE INCLUDING SEMICONDUCTOR ELEMENT SURROUNDED BY AN INSULATING MEMBER AND WIRING STRUCTURES ON UPPER AND LOWER SURFACES OF THE SEMICONDUCTOR ELEMENT AND INSULATING MEMBER, AND MANUFACTURING METHOD THEREOF

(75) Inventors: Shinji Wakisaka, Hanno (JP);
Hiroyasu Jobetto, Hachioji (JP);
Takeshi Wakabayashi, Sayama (JP);
Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 90 days.

(21) Appl. No.: 10/986,532

(22) Filed: Nov. 10, 2004

(65) Prior Publication Data
US 2005/0140021 A1    Jun. 30, 2005

(30) Foreign Application Priority Data
Nov. 10, 2003 (JP) .............................. 2003-379547
Nov. 26, 2003 (JP) .............................. 2003-395313

(51) Int. Cl.
*H01L 23/52* (2006.01)
(52) U.S. Cl. .................. 257/690; 257/684; 257/686; 257/698; 257/E23.178; 257/E25.01
(58) Field of Classification Search ............... 257/684, 257/686, 690, 698, 700, E23.178, E25.01
See application file for complete search history.

(56) References Cited
U.S. PATENT DOCUMENTS 5,337,027 A    8/1994 Namordi et al.

| | | | |
|---|---|---|---|
| 5,744,758 A | 4/1998 | Takenouchi et al. | |
| 6,222,259 B1 | 4/2001 | Park et al. | |
| 6,479,760 B2* | 11/2002 | Kimbara et al. | 174/260 |
| 6,525,414 B2* | 2/2003 | Shiraishi et al. | 257/686 |
| 6,528,871 B1 | 3/2003 | Tomita | |
| 6,590,291 B2* | 7/2003 | Akagawa | 257/774 |
| 6,680,529 B2* | 1/2004 | Chen et al. | 257/700 |
| 6,770,971 B2* | 8/2004 | Kouno et al. | 257/734 |
| 6,952,049 B1* | 10/2005 | Ogawa et al. | 257/700 |
| 2001/0004130 A1 | 6/2001 | Higashi et al. | |
| 2001/0010627 A1 | 8/2001 | Akagawa | |
| 2002/0017710 A1 | 2/2002 | Kurashima et al. | |
| 2002/0053730 A1 | 5/2002 | Mashino | |

(Continued)

FOREIGN PATENT DOCUMENTS

EP    1 111 674 A2    6/2001

(Continued)

*Primary Examiner*—Matthew E. Warren
(74) *Attorney, Agent, or Firm*—Frishauf, Holtz, Goodman & Chick, P.C.

(57) ABSTRACT

A first semiconductor element is mounted on a base plate, and is in a sealed state by the periphery thereof being covered by an insulation member, and the upper surface thereof being covered by an upper insulation film. An upper wiring layer formed on the upper insulation film, and the lower wiring layer formed below the base plate via lower insulation films are connected by conductors. A second semiconductor element is mounted exposed, being connected to the lower wiring layer.

20 Claims, 27 Drawing Sheets

U.S. PATENT DOCUMENTS

| | | |
|---|---|---|
| 2002/0117743 A1 | 8/2002 | Nakatani et al. |
| 2002/0175402 A1* | 11/2002 | McCormack et al. ....... 257/700 |
| 2002/0187588 A1 | 12/2002 | Omizo et al. |
| 2002/0195700 A1 | 12/2002 | Li |
| 2003/0062624 A1 | 4/2003 | Asahi et al. |
| 2004/0056344 A1 | 3/2004 | Ogawa et al. |
| 2004/0150095 A1* | 8/2004 | Fraley et al. ............... 257/700 |
| 2004/0201085 A1 | 10/2004 | Ogawa et al. |
| 2004/0245614 A1 | 12/2004 | Jobetto |
| 2005/0218451 A1 | 10/2005 | Jobetto |

FOREIGN PATENT DOCUMENTS

| | | |
|---|---|---|
| JP | 10-100026 A | 4/1998 |
| JP | 11-265975 A | 9/1999 |
| JP | 2001-044641 A | 2/2001 |
| JP | 2001-094046 A | 4/2001 |
| JP | 2001-217337 A | 8/2001 |
| JP | 2001-250836 A | 9/2001 |
| JP | 2001-274034 A | 10/2001 |
| JP | 2001-339165 A | 12/2001 |
| JP | 2002-270712 A | 9/2002 |
| JP | 2002-280485 A | 9/2002 |
| JP | 2002-368184 A | 12/2002 |
| JP | 2003-158239 A | 5/2003 |
| JP | 2003-188314 A | 7/2003 |
| JP | 2003-197849 A | 7/2003 |
| JP | 2003-273321 A | 9/2003 |
| JP | 2003-318361 A | 11/2003 |

* cited by examiner

SEMICONDUCTOR DEVICE INCLUDING SEMICONDUCTOR ELEMENT SURROUNDED BY AN INSULATING MEMBER AND WIRING STRUCTURES ON UPPER AND LOWER SURFACES OF THE SEMICONDUCTOR ELEMENT AND INSULATING MEMBER, AND MANUFACTURING METHOD THEREOF

BACKGROUND OF THE INVENTION

1. Field of the Invention

The present invention relates to a semiconductor device and manufacturing method thereof.

2. Description of the Related Art

A multi chip semiconductor device wherein a plurality of semiconductor chips are mounted on the island of the lead frame, each semiconductor chip is bonded with an internal lead by wire, and the mounted plurality of semiconductor chips are resin molded entirely is disclosed in Unexamined Japanese Patent Application KOKAI Publication No. 2002-368184. This semiconductor device occupies a large mounting (occupation) area, because a plurality of semiconductor chips are mounted on one lead frame resulting in a large lead frame. Also the manufacturing cost is high, because wire bonding using a lead frame is adopted.

A semiconductor device having a small mounting area is disclosed in Unexamined Japanese Patent Application KOKAI Publication No. 2003-273321. This semiconductor device has a plurality of double-sided substrates on each of which a semiconductor chip or chips are mounted. The substrates are stacked or laminated by, for example, a hot pressing.

A semiconductor device disclosed in Unexamined Japanese Patent Application KOKAI Publication No. 2001-094046, has two stacked bare chips mounted on center of an upper surface of a base plate. Connecting pads provided on periphery area of the upper surface of each bare chip are connected with connecting pads provided on periphery of the upper surface of the base plate by bonding wires. To enable wire bonding of the lower-side bare chip, the size of the upper-side bare chip is smaller than that of the lower-side bare chip so that the periphery of the upper surface of the lower bare chip is exposed, and the connecting pads provided on the upper bare chip is at an inner side than the connecting pads provided on the lower bare chip. Further, because wire bonding of the upper bare chip is carried out after that of the lower bare chip, at the upper surface of the base plate, the connecting pads for the lower bare chip are arranged outside of the mounting area the lower bare chip, and the connecting pads for the upper bare chip are arranged at the outer side thereof.

The semiconductor device disclosed in above mentioned Unexamined Japanese Patent Application KOKAI Publication No. 2003-273321, has double-sided boards on which a semiconductor chip is mounted, by polymerizing a conductive connection terminal formed on each double-sided board. As for this semiconductor device, because each circuit board is thick and expensive, the entire semiconductor device is also thick and expensive. Also, because each layer is bonded, it is hard to obtain reliability of intensity, in accordance with environmental change. The semiconductor device disclosed in Unexamined Japanese Patent Application KOKAI Publication No. 2001-094946, because the connecting pads for the lower bare chip are arranged at the upper surface of the base plate, and the connecting pads for the upper bare chip are arranged at the outer side thereof, when the number of stacked semiconductor chips increase, the area occupied by pads on the base plate becomes larger. Therefore, the area of the entire semiconductor device becomes larger. Further, because the length of the wire becomes longer, the value of resistance becomes larger, and becomes inadaptable to a high frequency.

Therefore an object of the present invention is to provide a semiconductor device of which the mounting area is small and a reliability of intensity in the connecting units is secured, and a manufacturing method thereof.

SUMMARY OF THE INVENTION

To achieve the above object, a semiconductor device according to a first aspect of the present invention comprises:

a first semiconductor element that has a plurality of electrodes for external connection;

an insulation member provided at the periphery of the fist semiconductor element;

an upper layer wiring structure provided at an upper surface side of the first semiconductor element and the insulation member;

a lower layer wiring structure provided at a lower surface side of the first semiconductor element and the insulation member; and a second semiconductor element that is mounted on at least, one of the upper layer wiring structure and the lower layer wiring structure.

A manufacturing method of the semiconductor device according to a second aspect of the present invention comprises:

forming a first semiconductor element wherein each semiconductor element comprises a plurality of electrodes for external connection, by the base plate, the insulation film, and the upper insulation film, by respectively sealing;

forming an upper rerouting on the upper insulation film;

forming a lower rerouting layer below the base plate;

mounting a second semiconductor element on at least either the upper rerouting layer or the lower rerouting layer; and obtaining a plurality of semiconductor devices that comprise at least one semiconductor element and at least one second semiconductor element, by cutting the base plate, the insulation member, and the upper insulation film.

DETAILED DESCRIPTION OF THE PREFERRED EMBODIMENT

First Embodiment

Figure 1:
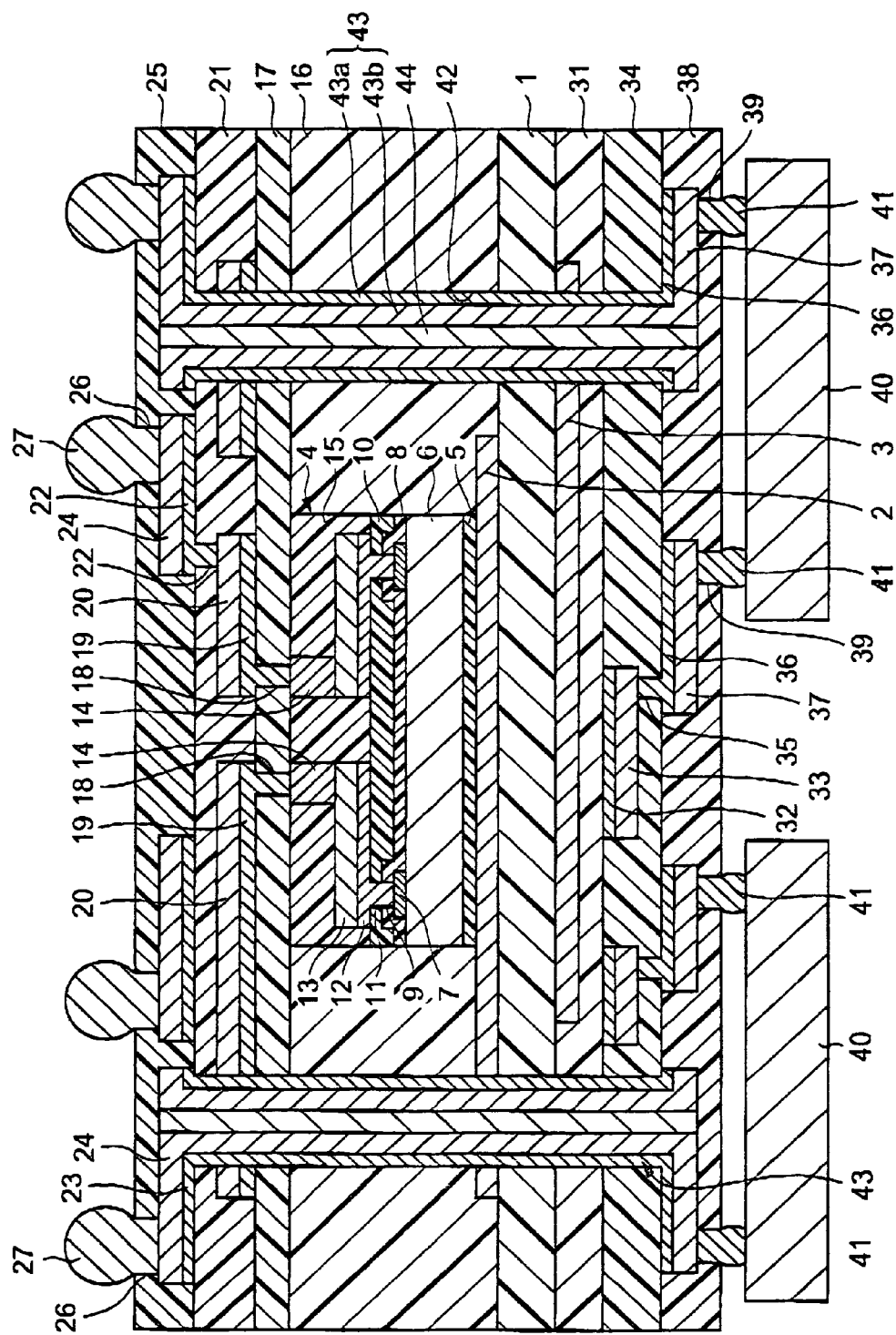
FIG. 1 is a cross-sectional view of a semiconductor device according to a first embodiment of the present invention.

A semiconductor device according to the first embodiment of the present invention will be described with reference to the cross-sectional view of FIG. 1. This semiconductor device comprises a rectangular shaped base plate 1. The base pale is made of, for example epoxy base resin permeated into a glass fabric base. An upper layer wiring 2 made of copper foil is formed on the upper surface of the base plate 1, and a lower layer wiring 3 made of copper foil is formed on the lower surface of the base plate 1. The upper layer wiring 2 serves as a ground wiring and has a pattern formed on substantially the whole surface. The lower layer wiring 3 serves as a current source (power source) wiring and has a pattern formed on substantially the whole surface.

A semiconductor element 4 is provided on the upper wiring 2. More specifically, the semiconductor element 4 has a rectangular outer shape and has a size smaller than that of the base plate 1 to a certain extent. The bottom surface of the semiconductor element 4 is attached to the upper surface of the upper wiring 2 via an adhesive layer 5 made of a die-bonding substance. The semiconductor element 4 comprises later-described distributing wiring layers, columnar electrodes, and a sealing film, and is generally called a CSP (Chip Size Package). The semiconductor element 4 is also called a wafer level CSP (W-CSP) because a semiconductor element 4 is obtained by dicing a silicon wafer, after the distributing wiring layers, columnar electrodes, and a sealing film are formed on the wafer.

The structure of the semiconductor element 4 will be described in detail below.

The semiconductor element 4 comprises a silicon substrate (semiconductor substrate) 6. The silicon substrate 6 is attached to the base plate 1 via the adhesive layer 5. An integrated circuit (not shown) having a predetermined function (for example, function as a CPU) is formed in the upper surface region of the silicon substrate 6. A plurality of connecting pads 7 connected to the integrated circuit and made of aluminum alloy, etc., are formed on the periphery of the upper surface. An insulation film 8 made of silicon oxide, etc., is formed on the upper surface of the silicon substrate 6 excluding the center portions of the connecting pads 7. The center portions of the connecting pads 7 are exposed via openings 9 provided in the insulation film 8.

An overcoat film (insulation film) 10 made of epoxy resin, or polyimide resin, etc., is formed on the insulation film 8. Openings 11 are formed in the areas of the overcoat film 10 that correspond to (overlap with) the openings 9 of the insulation film 8. Base metal layers 12 made of copper, etc., are provided on the upper surface of the overcoat film 10. Distributing wiring layers 13 made of copper are provided on the entire upper surface of the base metal layers 12, respectively. The base metal layers 12 and the stacked distributing wiring layers 13 serve as multi-layered (two-layered) distributing wiring layers (rerouting layers) as a whole. One end portion of each distributing wiring layers 13 including respective base metal layer 12 is connected to the respective connecting pad 7 via both openings 9 and 11.

Columnar electrodes (external connection electrode) 14 made of copper are provided on the upper surfaces of connecting pads of the distributing wiring layers 13. The height of each columnar electrode 14 is 60 to 150 μm. A sealing film (insulation film) 15 made of epoxy resin or polyimide resin, etc., is provided on the upper surface of the overcoat film 10 including the distributing wiring layer 13, such that the upper surface of the overcoat film 10 is flush with the upper surface of the columnar electrode 14.

In this way, the semiconductor element 4, called the W-CSP, comprises the silicon substrate 6, connecting pads 7, insulation film 8, the overcoat film 10, distributing wiring layers 13, columnar electrodes 14, and the sealing film 15.

An insulating layer 16 having a rectangular frame like shape is formed on the upper surface of the base plate 1 including the upper layer wiring 2, so as to surround the periphery of the semiconductor element 4. The upper surface of the insulating layer 16 is substantially flush with the upper surface of the semiconductor element 4. The insulation layer 16 is made of for example, thermosetting resin, or resin including a reinforcer such as glass fiber or silica filler, etc., diffused therein.

A first upper insulation film 17 is provided on the upper surface of the semiconductor element 4 and the insulation layer 16, such that the upper surface thereof is flat. The first upper insulation film 17 is made of so-called build-up material commonly used in, for example, a build-up substrate, and for example is made of thermosetting resin such as epoxy resin or BT (Bismaleimide Triadin) resin, etc., including a reinforcer such as fiber or filler, etc., diffused therein. The fiber may be glass fiber or aramid fiber, etc. The filler may be silica filler or ceramics filler, etc.

Openings 18 are formed in the first upper insulation film 17 and on the center portions of the columnar electrodes 14, respectively. First upper base metal layers 19 made of copper, etc., are formed on the upper surfaces of the first upper insulation films 17. First upper distributing wiring layers 20 made of copper are provided on the entire upper surfaces of the first upper base metal layers 19, respectively. The first upper base metal layers 19 and the stacked first upper distributing wiring layers 20 serve as multi-layered (two-layered) distributing wiring layers (rerouting layers) as a whole. One end portion of each first upper base metal layer 19 and the first upper distributing wiring layer 20 is connected to the upper surface of respective columnar electrode 14 via respective opening 18 formed in the first upper insulation film 17.

A second upper insulation film 21 made of the same material as the first upper insulation film 17 is provided on the upper surface of the first upper distributing wiring layer 20 and the first upper insulation film 17. Openings 22 are formed in the areas of the second upper insulation film 21 that correspond to at least a part of the connecting pad of respective first upper distributing wiring layer 20. Second upper base metal layer 23 made of copper, etc., are provided on the upper surfaces of the second upper insulation films 21, respectively. Second upper distributing wiring layers 24 made of copper are provided on the upper surface of the second upper base metal layers 23, respectively. The second upper base metal layers 23 and the stacked second upper distributing wiring layers 24 serve as multi-layered (two-layered) distributing wiring layers (rerouting layers). At least a part of end portion of each second upper base metal layer 23 and the second upper distributing wiring layer 24 is connected to the connecting pad of the first upper distributing wiring layer 20 via the opening 22 of the second upper insulation film 21.

A top insulation film 25 made of solder resist, etc., is provided on the upper surface of the second upper distributing wiring layer 24 and the second upper insulation film 21. An opening 26 is provided in the part of the top insulation film 25 that corresponds to the connecting pad of the second upper distributing wiring layer 24. A plurality of solder balls 27 are provided in the interior and upside of the opening 26 being connected to the connecting pad of the second upper distributing wiring layer 24. The plurality of solder balls 27 are arranged in a matrix, on top of the top insulation film 25.

A lower insulation film 31 made of the same material as the first upper insulation film 17 is provided on the lower surface of the base plate 1 and the lower layer wiring 3. And the lower surface of a lower insulation film 31 is flat. First lower base metal layers 32 made of copper, etc., are provided on the lower surfaces of the first lower insulation films 31, respectively. First lower distributing wiring layers 33 made of copper are provided on almost entire lower surfaces of the first lower base metal layers 32, respectively. The base metal layers 32 and the stacked first distributing wiring layers 33 serve as multi-layered (two-layered) distributing wiring layers (rerouting layers) as a whole.

A second lower insulation film 34 made of the same material as the first upper insulation film 17 is provided on the lower surface of the first lower distributing wiring layers 33 and the first lower insulation film 31. Openings 35 are formed in the areas of a second lower insulation film 34 that correspond to the connecting pads of the first lower distributing wiring layers 33. Second lower base metal layers 36 made of copper, etc., are provided on the lower surfaces of the second lower insulation films 34. Second lower distributing wiring layers 37 made of copper are provided on the entire lower surfaces of the second lower base metal layers 36, respectively. The second lower base metal layers 36 and the stacked second lower distributing wiring layers 37 serve as multi-layered distributing wiring layers as a whole. At least a part of one end portion of each second lower distributing wiring layers 37 including respective second lower base metal layer 36 is connected to the connecting pad of the respective first lower distributing wiring layer 33 via the respective opening 35 formed in the second lower insulation film 34.

A bottom insulation film 38 made of solder resist, etc., is provided on the lower surfaces of the second lower distributing wiring layers 37 and the second lower insulation films 34. Openings 39 are formed in the areas of the bottom insulation film 38 that correspond to the connecting pads of the second lower distributing wiring layers 37. A plurality of semiconductor elements 40 are mounted at the lower surface of the bottom insulation film 38 in the state that a plurality of solder balls 41 provided on the upper surface of the semiconductor elements 40 are connected to the connecting pads of the second lower distributing wiring layers 37 via the openings 39 in the bottom insulation film 38.

Though the detail of the semiconductor element 40 is not shown in the drawings, the semiconductor element 40 may be a bare chip, a BGA (Ball Grid Array), or a CSP, etc. Each of the semiconductor elements 40 has a semiconductor substrate made of silicon, etc. An integrated circuit having a predetermined function (for example, function as a semiconductor memory) is formed in the upper surface region of each semiconductor substrate. A plurality of connecting pads which are made of aluminum, etc. and connected to the integrated circuit, are formed at the periphery areas of upper surface of each semiconductor substrate. Solder balls 41 are provided on the connecting pads or external connecting electrodes such as columnar electrodes, connected to the connecting pads.

Penetrating (through) hole 42 are formed so as to penetrate predetermined places of the first upper insulation film 17, the insulation layer 16, the base plate 1 including the upper layer wiring 2 and the lower layer wiring 3, the first lower insulation film 31, the first lower distributing wiring layer 33 including the first lower base metal layer 32 (layers 32 and 33 are provided at a position not shown in FIG. 1), and the second lower insulation film 34. Vertical conductors 43 are formed on the inner wall of the penetrating holes 42, respectively. Each vertical conductor 43 comprises a base metal layer 43a made of copper, etc. formed on the inner wall of the hole 42, and a copper layer 43b formed on the base metal layer 43a.

The second upper distributing wiring layer 24 including the second upper base metal layer 23, the first upper distributing wiring layer 20 including the upper base metal layer 19, the upper wiring 2 or the lower wiring 3, and the second lower distributing wiring layer 37 including the second lower base metal layer 36, are connected by the vertical conductors 43. In FIG. 1, the upper wiring 2 is connected to the left side vertical conductor 43, and the lower wiring 3 is connected to the right side vertical conductor 43.

To make the electric conductivity of the vertical conductor 43 higher, a conductivity material 44 made of copper paste, silver paste, conductivity resin, etc., is filled in the vertical conductor 43. Instead, insulation resin may be filled in the vertical conductor 43, or the interior of the vertical conductor 43 may be hollow.

As an example, the columnar electrode 14 for the ground is connected to the upper layer wiring 2 served as the ground wiring via the first upper distributing wiring layer 20 and the vertical conductor 43. The columnar electrode 14 for power source is connected to the lower layer wiring 3 served as the power source wiring via the first upper distributing wiring layer 20 and the vertical conductor 43.

The solder ball 41 for the ground of the semiconductor element 40 is connected to the upper wiring 2 served as the ground wiring, via the second lower distributing wiring layer 37 and the vertical conductor 43. The solder ball 41 for power source of the semiconductor element 40 is connected to the lower wiring 3 served as the power source wiring, via the second lower distributing wiring layer 37 and the vertical conductor 43.

The solder ball 41 for signal of the semiconductor element 40 is connected to the columnar electrode 14 for signal of the semiconductor element 4 via the first upper distributing wiring layer 20, the vertical conductor 43, the first lower distributing wiring layer 33, and the second lower distributing wiring layer 37. The ground wiring including layers 2, 23, 24, 36, and 37 and vertical conductor 43 is connected to the solder ball 27 for ground. The power source wiring including layers 3, 23, 24, 36, and 37 and the vertical conductors 43 is connected to the solder ball 27 for power source. The signal wiring connected to a signal terminal of the semiconductor element 4 or 40 is connected to the solder ball 27 for signal.

As an example, the thickness of the silicon substrate 6 is 0.1 to 0.35 mm, the thickness of the columnar electrode 14 is 0.06 to 0.15 mm, the thickness of the semiconductor element 4 is 0.25 to 0.5 mm, the total thickness of the first upper insulation film 17 to the top insulation film 25 is 0.2 to 0.25 mm, the total thickness of the base plate 1 to the bottom insulation film 38 is 0.25 to 0.3 mm, the thickness of the semiconductor element 40 is 0.25 to 0.3 mm, and the entire thickness is 1.0 to 1.2 mm.

The reason that the base plate 1 is larger than the semiconductor element 4 to a certain extent in plane, is for obtaining the enough arrangement area where the solder balls 27 are arranged in matrix form larger than the semiconductor element 4 in accordance with the number of the connecting pads 7 on the silicon substrate 6, thereby making the size and pitch of the connecting pads (interior conductive parts of the openings 26 in the top insulation film 25) in the second upper distributing wiring layer 24 larger than the size and pitch of the columnar electrodes 14.

The connecting pads in the second upper distributing wiring layer 24 arranged in a matrix form (rows and columns) are arranged on not only the region corresponding to the semiconductor element 4, but also to the region that corresponds to the insulation layer 16 provided outside of the perimeter side surface of the semiconductor element 4. In other words, of the solder balls 27 arranged in a matrix, at the least, the solder balls 27 at the most outer circumference are arranged outside of the semiconductor element 4.

In this semiconductor device, the semiconductor element 4 works as a CPU is provided on above the base plate 1, and a plurality of semiconductor elements 40 works as semiconductor memories are provided below the base plate 1. In other words, semiconductor elements having different functions are stacked with each other. Therefore, the size or occupation area of the semiconductor device can be smaller than that of the device where the semiconductor elements are arranged on one plane. Therefore, the size of the device can be small even if the semiconductor device comprises semiconductor elements 4, 40 having different functions. Further, according to this embodiment, the number of steps for forming the semiconductor device can be reduced compared with a case where these wirings 2 and 3 are formed by the build-up process, because the upper layer wiring 2 and lower layer wiring 3 made of copper foils are provided on the upper and lower surface of the base plate 1.

Next, an example of a manufacturing method of this semiconductor device will be described.

First, an example of the manufacturing method of the semiconductor element 4 will be described.

Figure 2:
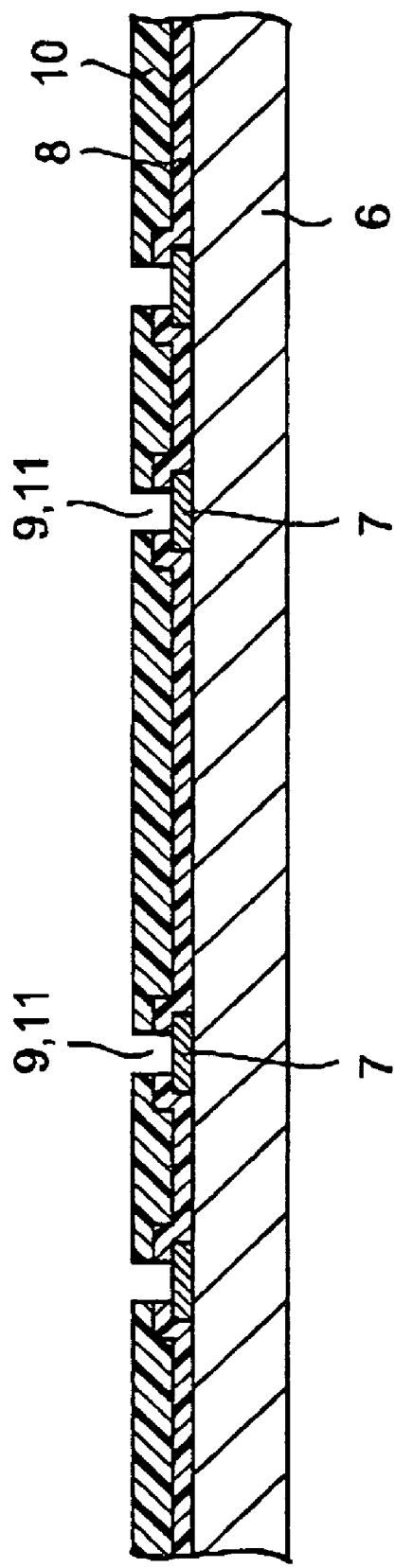
FIG. 2 is a cross-sectional view of a component initially prepared for manufacturing the semiconductor device shown in FIG. 1.

A silicon substrate (semiconductor substrate) 6 in a wafer state, shown in FIG. 2, is prepared. Integrated circuits having a predetermined function are formed in each element region of the silicon substrate 6. Connecting pads 7 electrically connected to respective integrated circuits are formed on the upper surface region of the semiconductor substrate 6. The connecting pads 7 may be made of aluminum, etc. On the substrate 6 and the connecting pads 7, an insulation film 8 made of silicon oxide, etc., and the overcoat film 10 made of epoxy resin, or polyimide resin, etc., are formed. The center portions of the connecting pads 7 are exposed by the openings 9, 11 formed in the insulation film 8 and the overcoat film 10.

Figure 3:
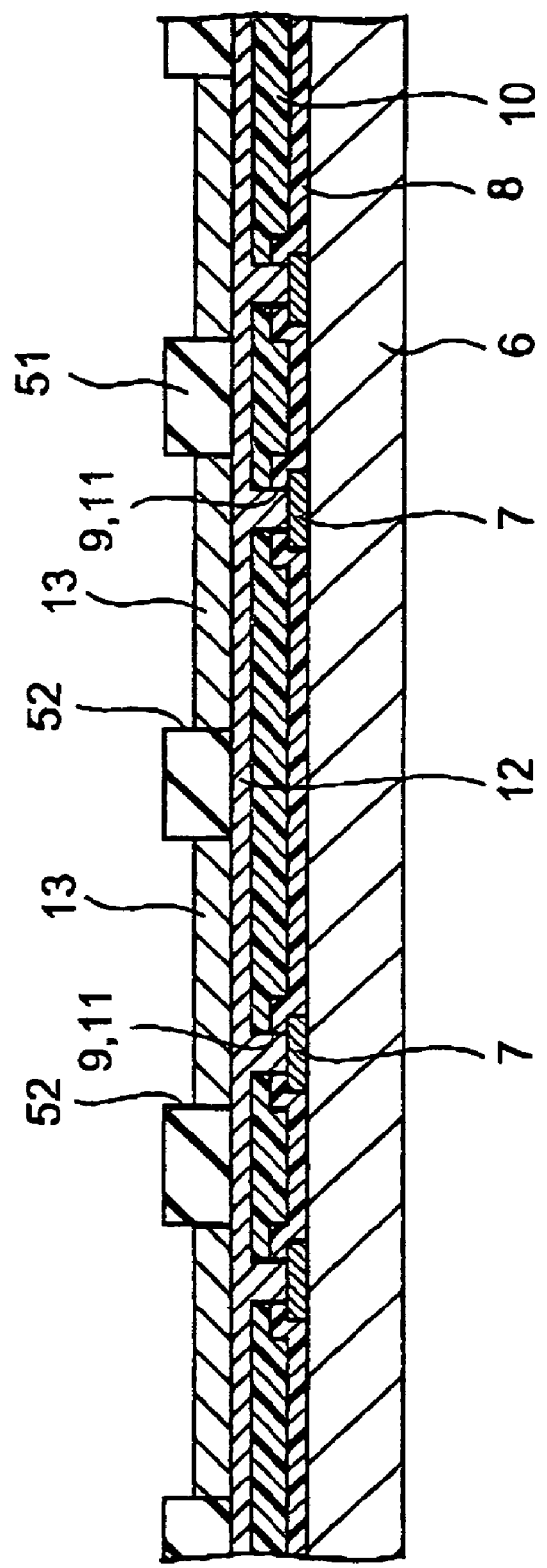
FIG. 3 is a cross-sectional view of the semiconductor device in a manufacturing step succeeding the step of FIG. 2.

Next, as shown in FIG. 3, a base metal layer 12 is formed on the entire upper surface of the overcoat film 10 and the center portions of the connecting pads 7 exposed via both openings 9 and 11. The base metal layer 12 may be a copper layer formed by electroless deposition (plating) or sputtering. Further, the base metal layer 12 may have a multi-layered structure comprises, for example, a thin film layer of titanium, etc., formed on the substrate 6 by sputtering and a copper layer formed on the thin film by spattering.

A plating resist film 51 is formed on the resultant structure. Then, the plating resist film 51 is patterned by, for example, PEP (Photo Etching Process), so that openings 52 are formed in the areas corresponding to the regions on which the distributing wiring layers 13 are to be formed. Distributing wiring layers 13 are formed on the upper surface of the base metal layer 12 in the openings 52 of the plating resist film 51 by performing electrolytic plating of cupper using the base metal layer 12 as a plating current path (electrodes). Then, the plating resist film 51 is removed.

Figure 4:
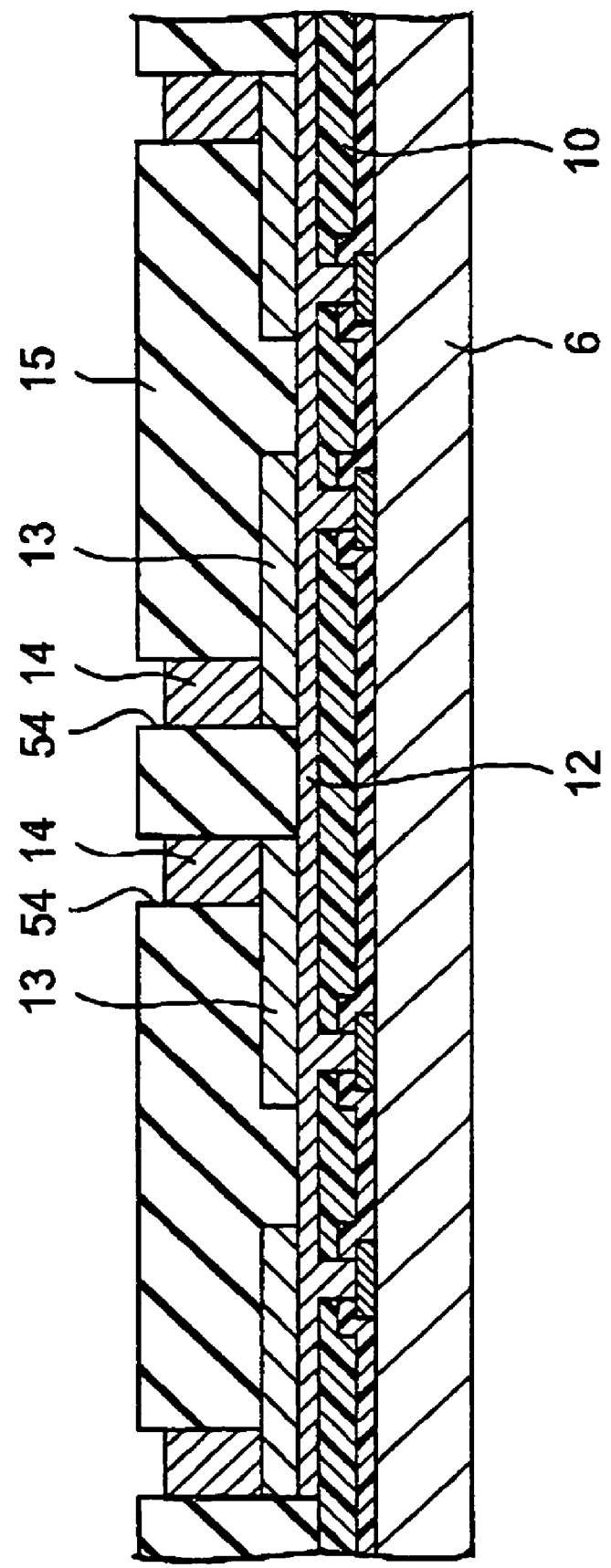
FIG. 4 is a cross-sectional view of the semiconductor device in a manufacturing step succeeding the step of FIG. 3.
Figure 5:
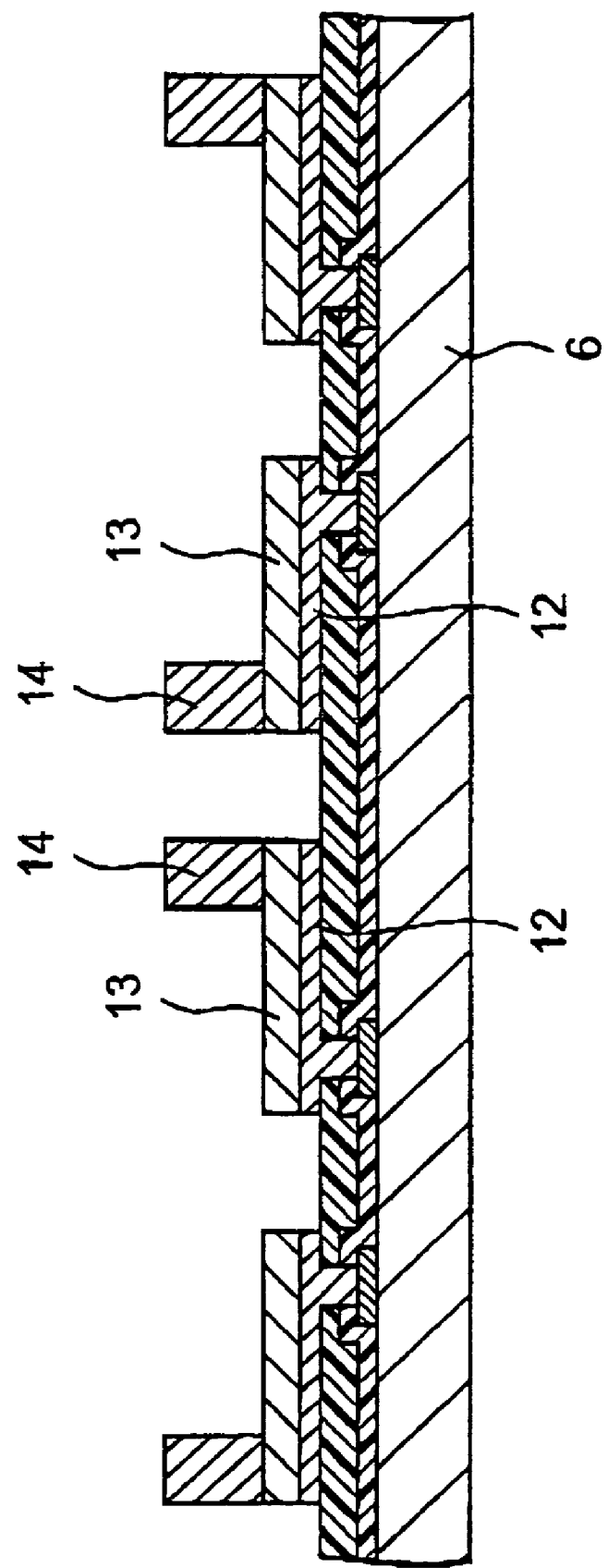
FIG. 5 is a cross-sectional view of the semiconductor device in a manufacturing step succeeding the step of FIG. 4.

Next, as shown in FIG. 4, a plating resist film 53 is formed on the resultant structure, namely, on the on the upper surface of the base metal layer 12 and the distributing wiring layers 13. Then, the plating resist film 53 is patterned by, for example, the PEP so as to from openings 54 at areas on which the columnar electrodes 14 are to be formed later. Then, by electrolytic plating of copper using the base metal layer 12 and the distributing wiring layers 13 as a plating current path, columnar copper layers are grown in the openings 54 of the plating resist film 53 and on the connecting pads areas of the distributing wiring layers 13. When the columnar electrodes 14 having a desired thickness are formed, the plating is stopped. The plating resist film 53 is removed. Then the unnecessary parts of the base metal layer 12 are removed by etching by using the distributing wiring layers 13 as the etching masks, thereby as shown in FIG. 5, the base metal layer 12 is left only below the distributing wiring layers 13.

Figure 6:
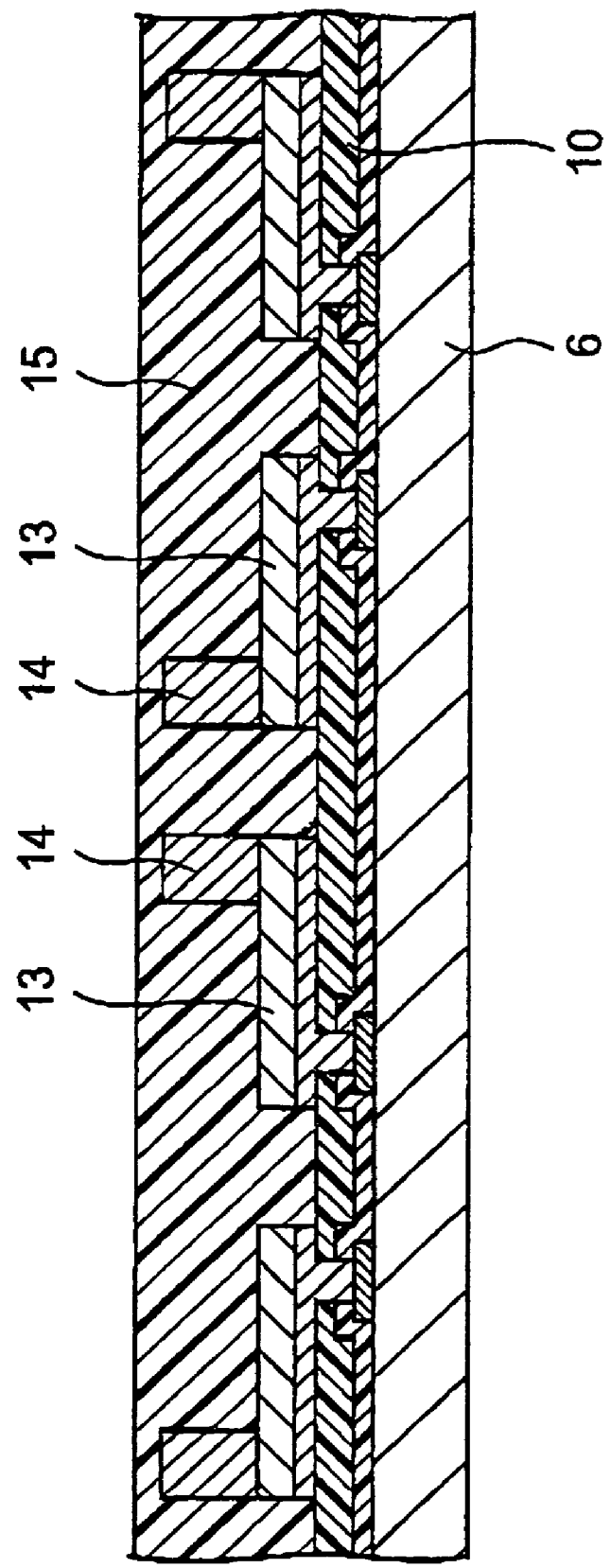
FIG. 6 is a cross-sectional view of the semiconductor device in a manufacturing step succeeding the step of FIG. 5.

As shown in FIG. 6 by a screen printing, a spin coating, or a die coating, etc., a sealing film 15 made of epoxy resin or polyimide resin, etc., is formed on the resultant structure, namely, on entire upper surface of the columnar electrode 14, the distributing wiring layer 13, and the overcoat film 10, such that the thickness thereof is thicker than the height of the columnar electrodes 14. In this state, the upper surfaces of the columnar electrodes 14 are covered with the sealing film 15 as shown in FIG. 6.

Figure 7:
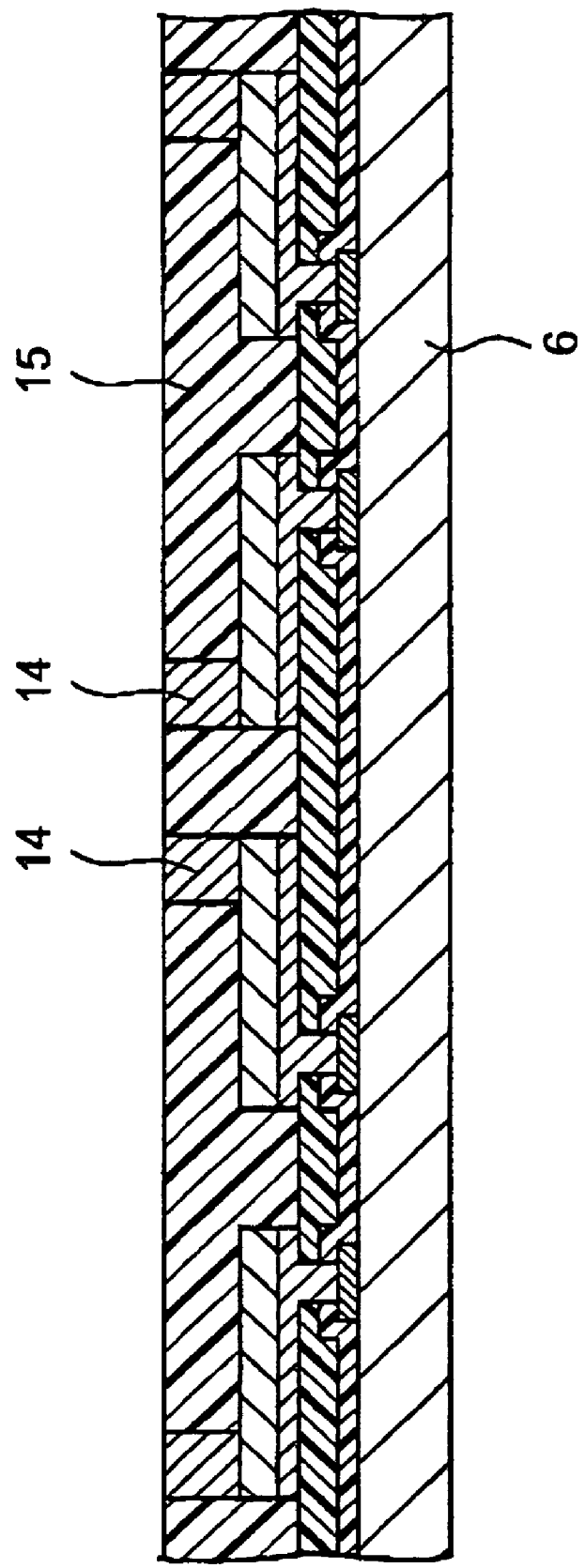
FIG. 7 is a cross-sectional view of the semiconductor device in a manufacturing step succeeding the step of FIG. 6.

The upper surfaces of the sealing films 15 and the columnar electrodes 14 is polished, by for example, the CMP (Chemical Mechanical Polishing) to expose the upper surface of the columnar electrode 14 and flatten the upper surface of the sealing film 15 and the upper surfaces of the exposed columnar electrodes 14, as shown in FIG. 7. The columnar electrodes 14 formed by the plating have different heights, the polishing makes the columnar electrodes 14 to have an equal height.

Figure 8:
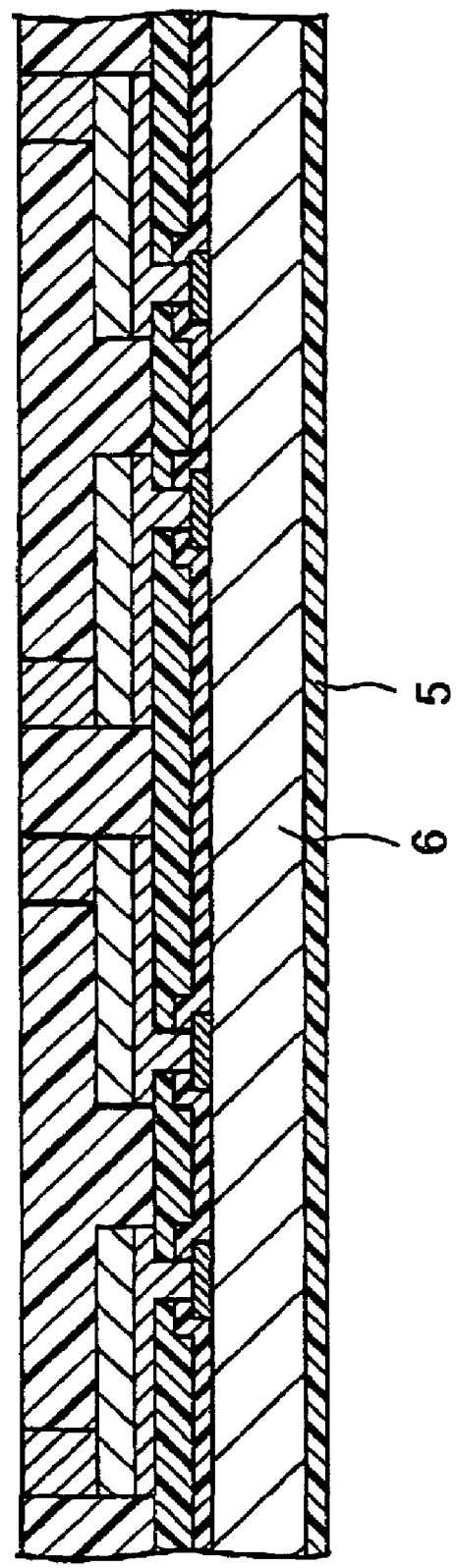
FIG. 8 is a cross-sectional view of the semiconductor device in a manufacturing step succeeding the step of FIG. 7.

As shown in FIG. 8, an adhesive layer 5 is adhered to the entire lower surface of the silicon substrate 6. The adhesive layer 5 is made of die bond material such as epoxy resin, and polyimide resin, etc., and is fixed to the silicon substrate 6 by hot pressing in a state of half-hardened. Next the adhesive layer 5 fixed to the silicon substrate 6 is attached to a dicing tape (not shown).

Figure 9:
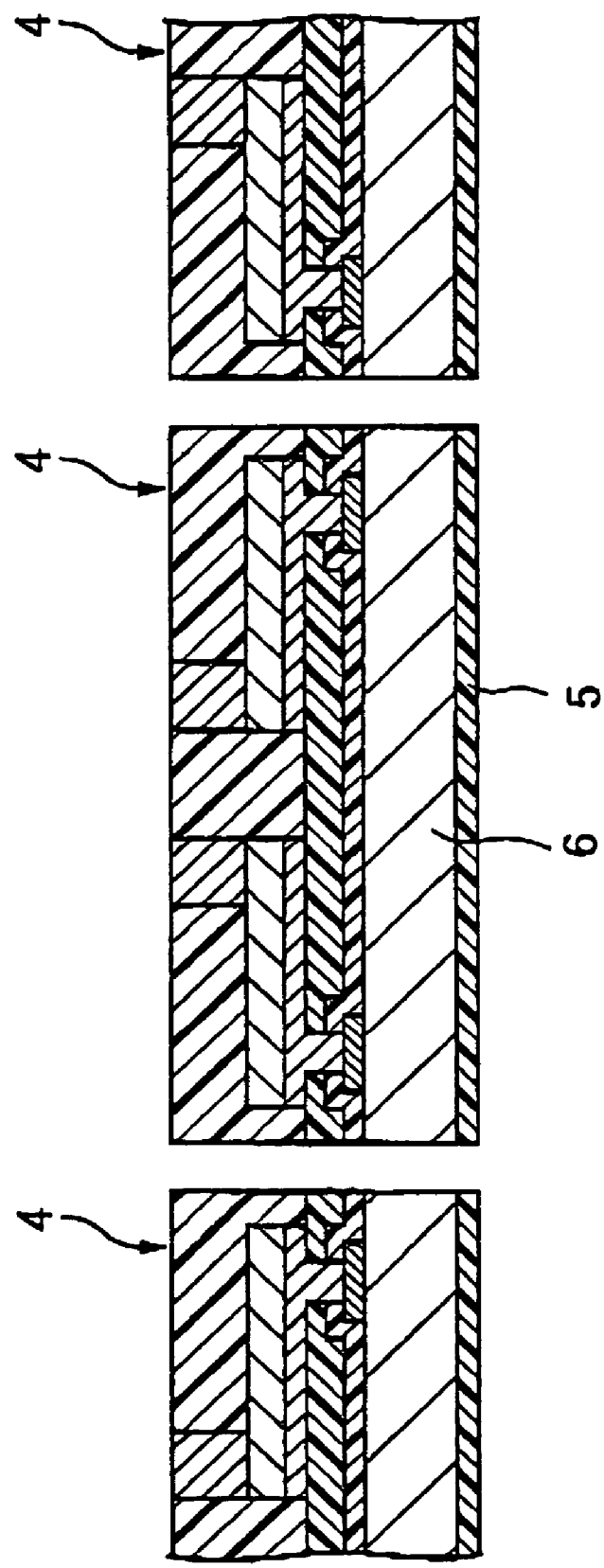
FIG. 9 is a cross-sectional view of the semiconductor device in a manufacturing step succeeding the step of FIG. 8.

The wafer is diced as shown in FIG. 9, thereby to obtain a plurality of semiconductor elements 4 that comprise the adhesive layer 5 on the lower surface of the silicon substrate 6. By separating the adhesive layer 5 from the dicing tape, the semiconductor element 4 shown in FIG. 1 is obtained.

Because the semiconductor element 4 obtained in this way comprises the adhesive layer 5 on the lower surface of the silicon substrate 6, it is unnecessary to provide an adhesive layers at the lower surface of the silicon substrate 6 of each of the semiconductor element 4. The operation for separating the adhesive layer from the dicing tape is easy compared with the operation for respectively providing an adhesive layer to the lower surface of the silicon substrate 6 of each the semiconductor element 4.

Next, an example of a manufacturing method of the semiconductor device with the semiconductor element 4 obtained in this way will be described.

Figure 10:
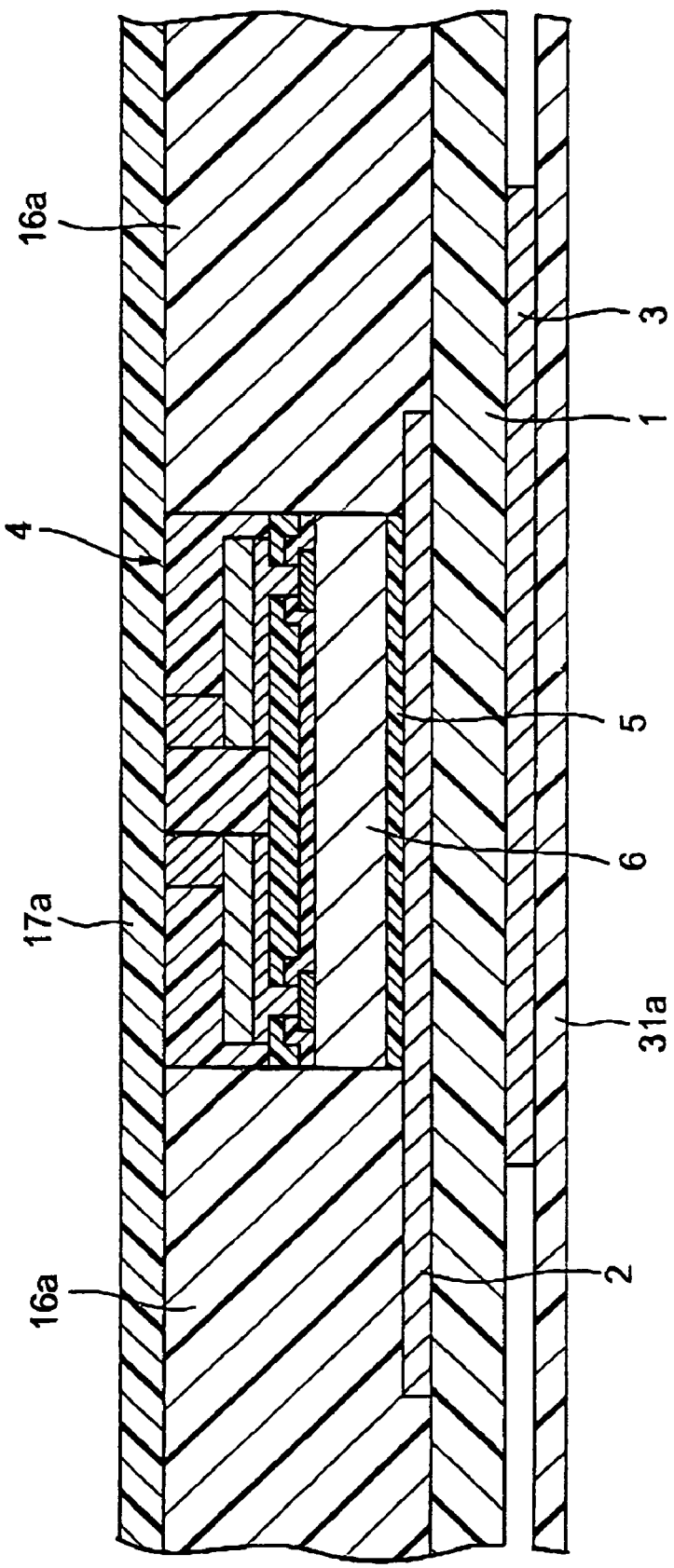
FIG. 10 is a cross-sectional view of the semiconductor device in a manufacturing step succeeding the step of FIG. 9.

First, as shown in FIG. 10, a plane rectangular base plate 1 with a size which a plurality of base plates 1 can be obtained is prepared. The plane shape of the base plate 1 is not limited to a rectangular. Copper foils are laminated to the upper and lower surface of the base plate 1. The upper layer wiring 2 and the lower layer wiring 3 are formed by patterning the copper foils with photolithography. A number of pairs of upper layer wiring 2 and the lower wiring layer are formed on the base plate 1 in a matrix form.

Then, the adhesive layers 5 adhered to each lower surface of the silicon substrates 6 of the semiconductor element 4 are adhered to predetermined places on the upper surface of the base plate 1. Here, the adhesive layers 5 are fully hardened by hot pressing. A predetermined number of the semiconductor elements 4 are arranged on the base plate 1 in a matrix form.

A first insulation material 16a is mounted on the upper surface of the base plate 1. More specifically, the first insulation material 16a is mounted on the upper surface of the base plate 1, and between the semiconductor elements 4 and at the outer side of the semiconductor elements 4 by a screen printing or a spin coating, etc.

A sheet-form second insulation material 17a is arranged on the upper surface of the semiconductor elements 4 and first insulation material 16a. A sheet-form third insulation material 31a is arranged on the lower surface of the base plate 1.

The first insulation material 16a is made of thermosetting resin, or thermosetting resin that includes a reinforcer such as glass fiber or silica filler, diffused therein. It is preferable that the sheet-form second and third insulation materials 17a and 31a are made of build up material. However it is not limited to the build up material. As this build up material, there is material that is half-hardened thermosetting resin such as epoxy resin or BT resin, etc into which silica filler is mixed. As the second and third insulation materials 17a and 31a, prepreg of a sheet-form by impregnating thermosetting resin such as epoxy resin, etc., into a glass fabric base, and half-hardening the thermosetting resin, or material made of only thermosetting resin which does not include filler mixed therein, may be used.

Figure 11:
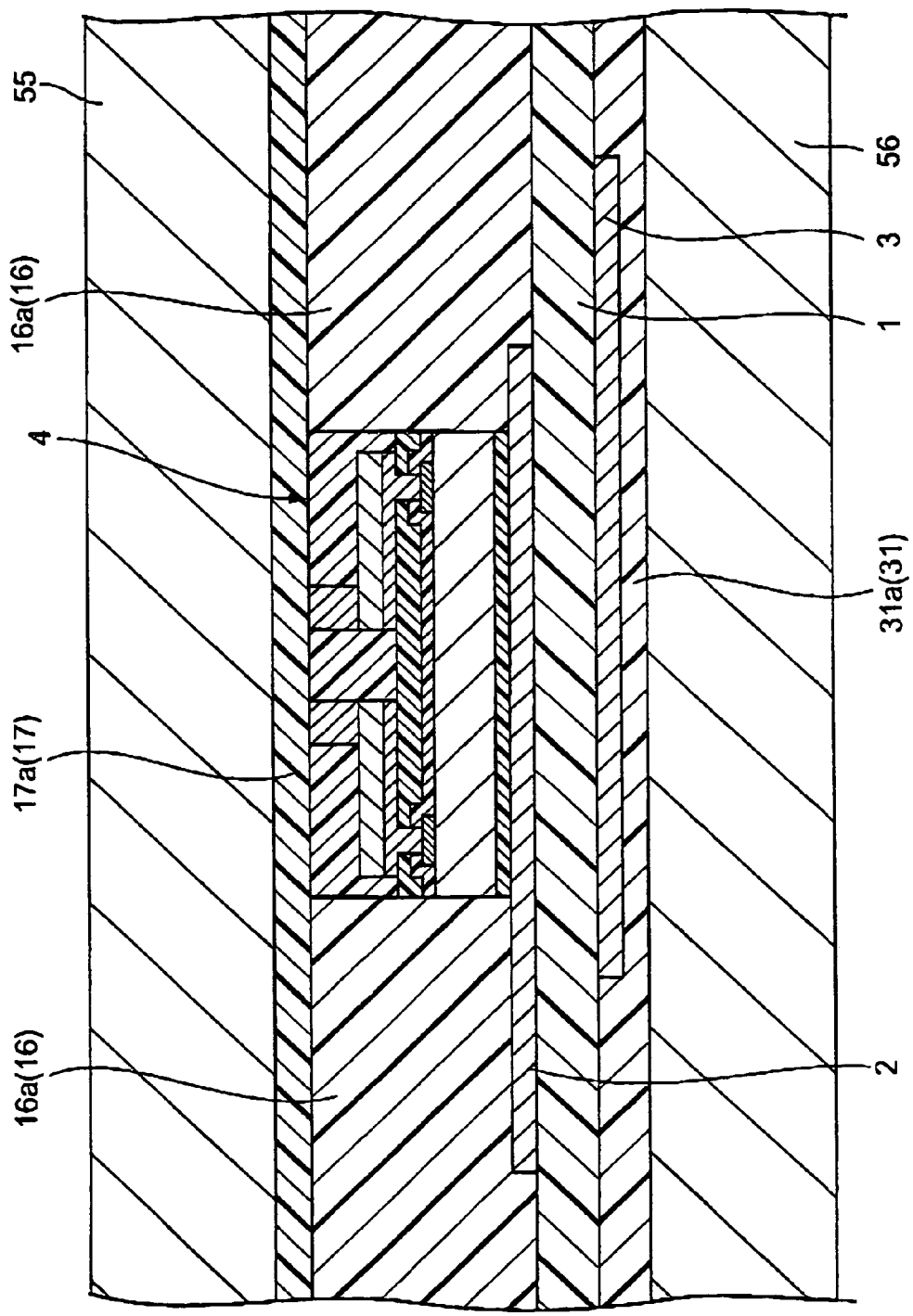
FIG. 11 is a cross-sectional view of the semiconductor device in a manufacturing step succeeding the step of FIG. 10.

The first to third insulation materials 16a, 17a, and 31a are hot pressed by using a pair of hot pressing plates 55, 56, shown in FIG. 11. Thereby, an insulation layer 16 is formed on the upper surface of the base plate 1 in between the semiconductor elements 4 and semiconductor elements 4 arranged at the most outer circumference in the matrix, a first upper insulation film 17 is formed on the upper surface of the semiconductor element 4 and the insulation layer 16, and a first lower insulation film 31 is formed on the lower surface of the base plate 1.

The upper surface of the first upper insulation film 17 becomes flat, because the upper surface of the first upper insulation film 17 is held down by the lower surface of the hot pressing plate 55 at the upper side. Also the lower surface of the first lower insulation film 31 becomes flat, because the lower surface of the first lower insulation film 31 is held down by the upper surface of the hot pressing plate 56 at the lower side. Therefore the polishing process flattening the upper surface of the first upper insulation film 17 and the lower surface of the first lower insulation film 31 is unnecessary. By this, even if the size of the base plate 1 is relatively large, for example approximately 500×500 mm, the upper surface of the first insulation film 17 and the lower surface of the first lower insulation film 31 can be flattened at the same time the first insulation film 17 and the insulation film 31 are formed on the plurality of semiconductor elements 4 arranged on the base plate 1.

Figure 12:
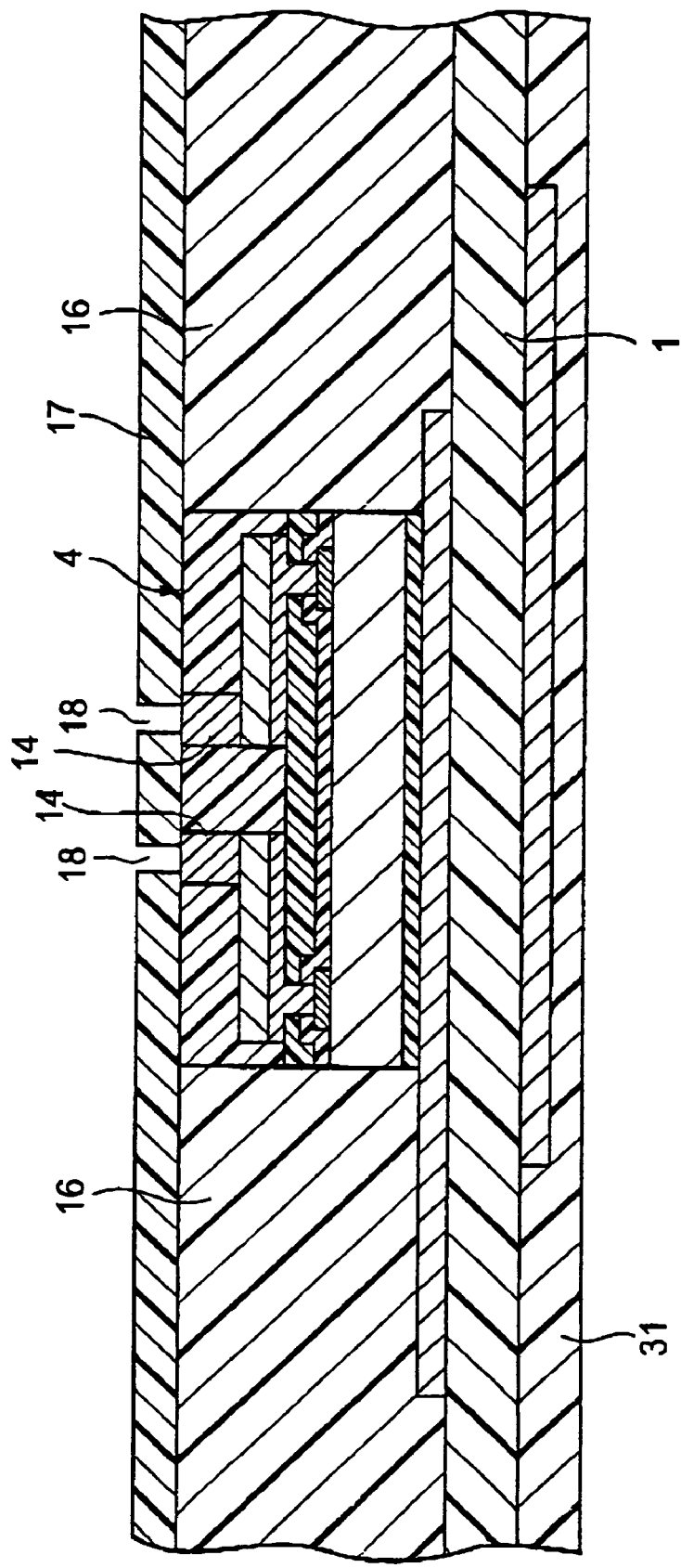
FIG. 12 is a cross-sectional view of the semiconductor device in a manufacturing step succeeding the step of FIG. 11.

As shown in FIG. 12, openings 18 are formed in the parts of the first insulation film 17 corresponding to the upper surface center portions of the columnar electrodes 14 by irradiating a laser beam. An opening is not formed in the first insulation film 31. If need, epoxy smear, etc., generated in the openings 18, etc., of the first upper insulation film 17 is removed by desmearing processing.

Figure 13:
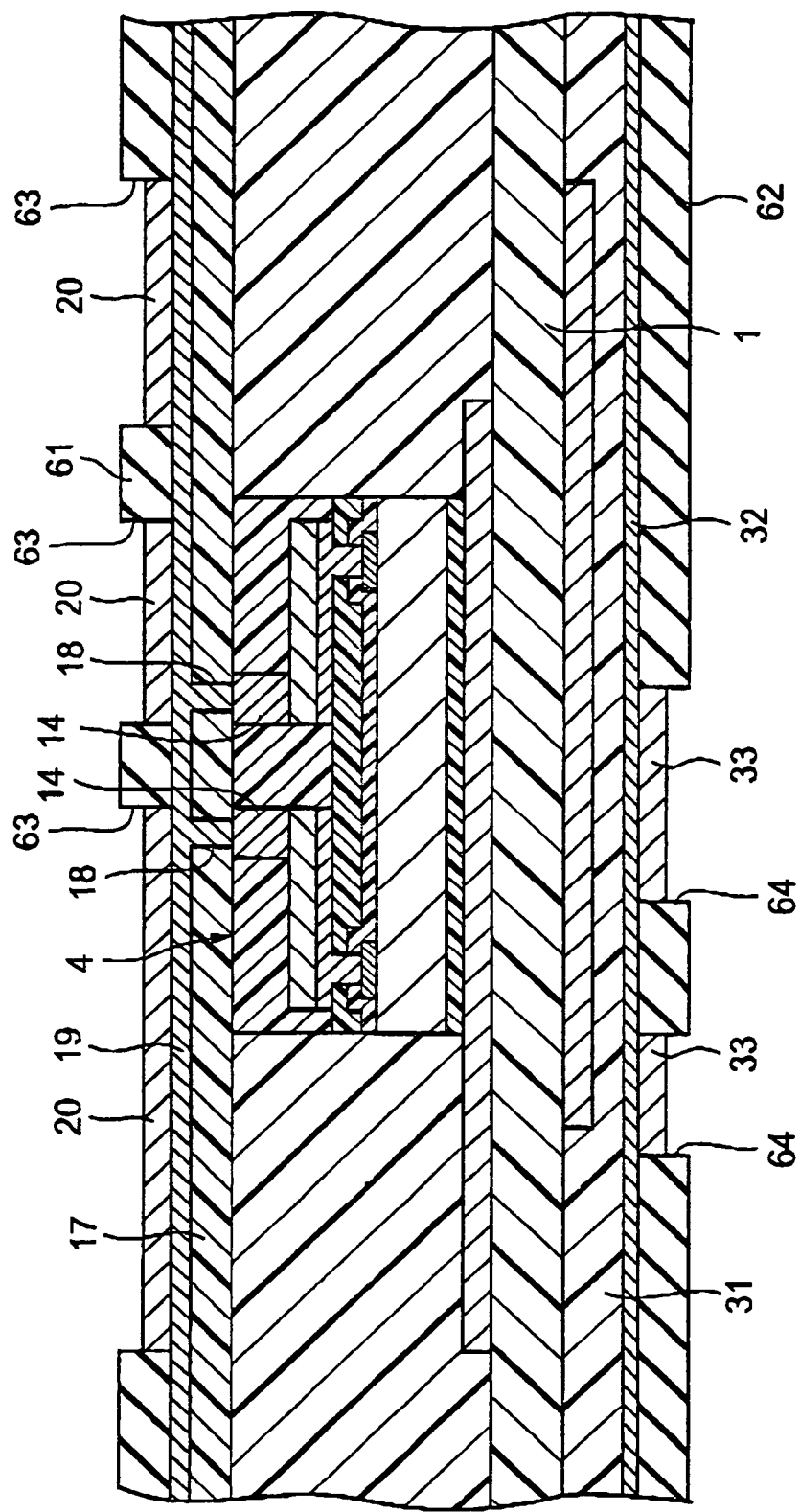
FIG. 13 is a cross-sectional view of the semiconductor device in a manufacturing step succeeding the step of FIG. 12.

Next, as shown in FIG. 13, a first upper base metal layer 19 is formed on the entire upper surface of the first upper insulation film 17 and the upper surfaces of the columnar electrodes 14 exposed via the openings 18, by electroless copper plating, etc. Also, a first upper base metal layer 32 are formed on the entire lower surface of the first lower insulation film 31, by electroless copper plating, etc.

Then an upper plating resist film 61 is formed on the upper base metal layer 19 and a lower plating resist film 62 is formed on the lower base metal layer 32. The upper plating resist film 61 is patterned so as to form the openings 63, and a lower plating resist film 62 is patterned so as to form the openings 64. The openings 63 are formed in the regions on which the first upper distributing wiring layers 20 are to be formed. The openings 64 are formed in the regions on which the lower distributing wiring layers 33 are to be formed.

The first upper distributing wiring layers 20 are formed on the upper surface of the first upper base metal layer 19 in the openings 63 of the upper plating resist film 61, and the first lower distributing wiring layers 33 are formed on the lower surface of the first lower base metal layer 32 in the openings 64 of the lower plating resist film 62, by electrolytic plating of copper using the base metal layers 19, 32 as the plating current path.

Figure 14:
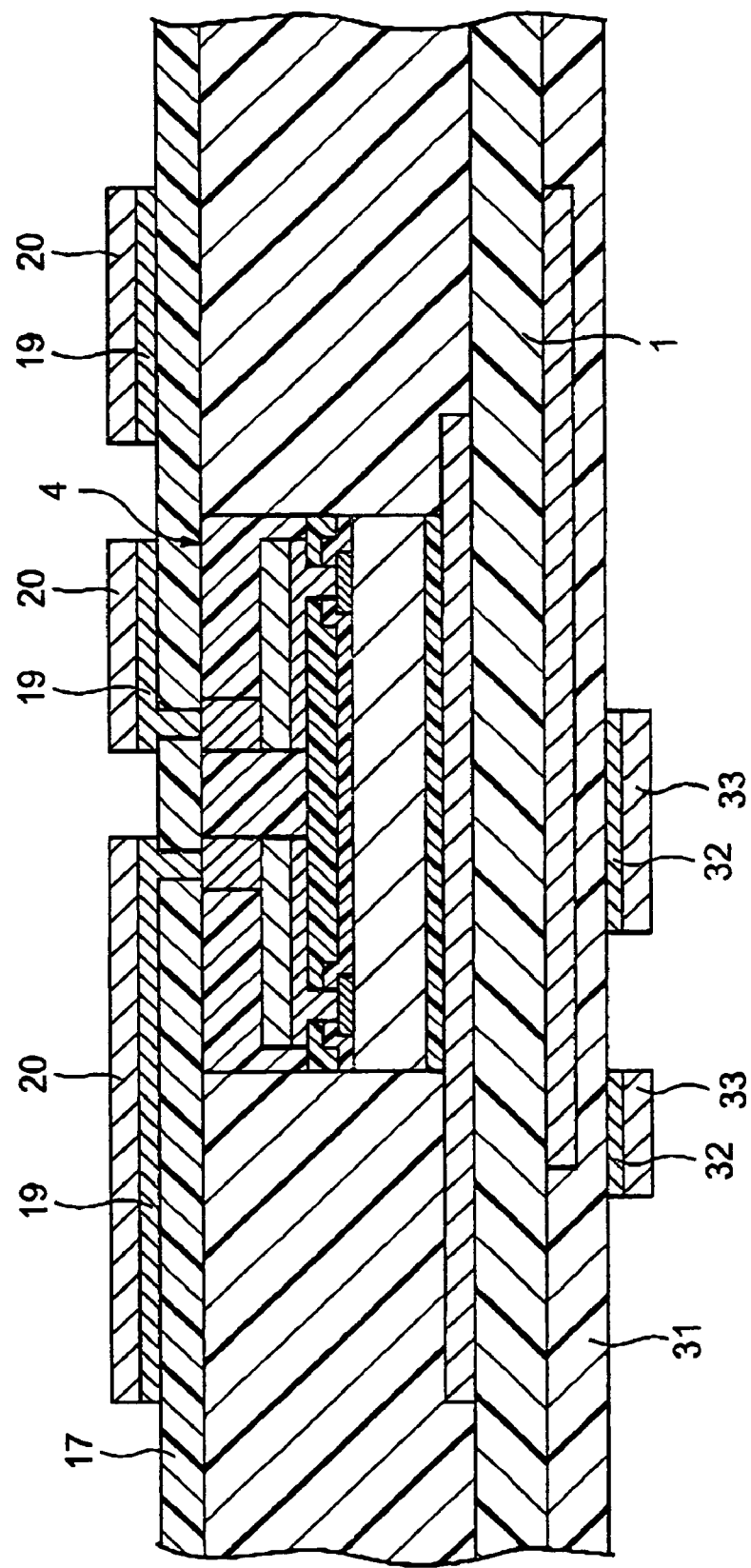
FIG. 14 is a cross-sectional view of the semiconductor device in a manufacturing step succeeding the step of FIG. 13.

The plating resist films 61, 62 are removed, then the unnecessary portions of the first upper base metal layer 19 and the first lower base metal layer 32 are removed by etching with using the first upper distributing wiring layer 20 and the first lower distributing wiring layer 33 as the mask. By this process, as shown in FIG. 14, the first upper base metal layer 19 is left only below the first upper distributing wiring layers 20, and the first lower base metal layer 32 is left only below the first lower distributing wiring layers 33.

Figure 15:
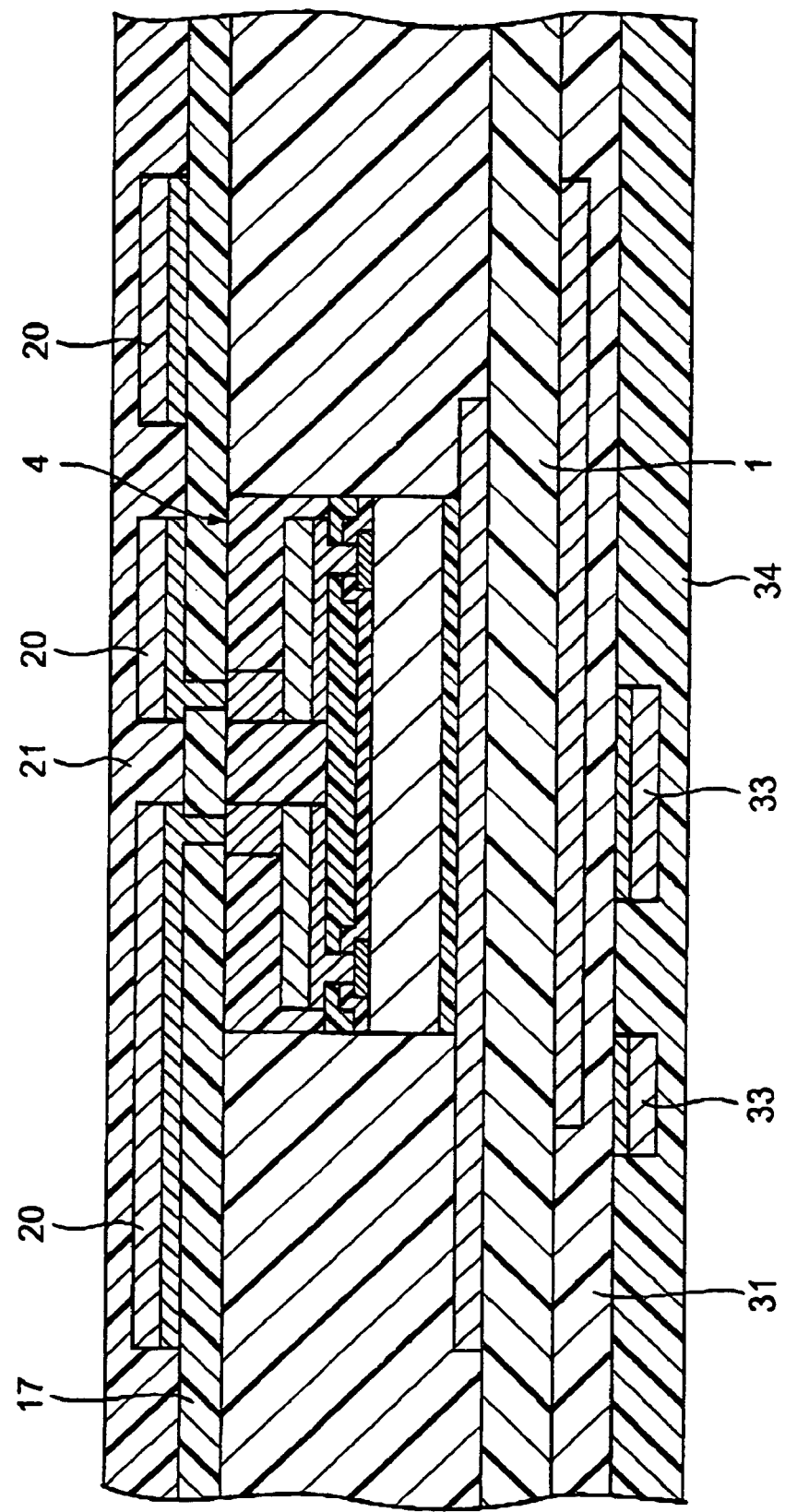
FIG. 15 is a cross-sectional view of the semiconductor device in a manufacturing step succeeding the step of FIG. 14.

As shown in FIG. 15, a second upper insulation film 21 is formed on the upper surface of the first upper distributing wiring layers 20 and the first upper insulation film 17 by a screen printing, a spin coating, or a die coating, etc., and a second lower insulation film 34 is formed on the lower surfaces of the first lower insulation film 31 and the first lower distributing wiring layers 33. The same material as the first upper insulation film 17 may be used for the second upper insulation film 21 and the second lower insulation film 34. However, they may be formed of a different material from the first upper insulation film 17 described above.

Figure 16:
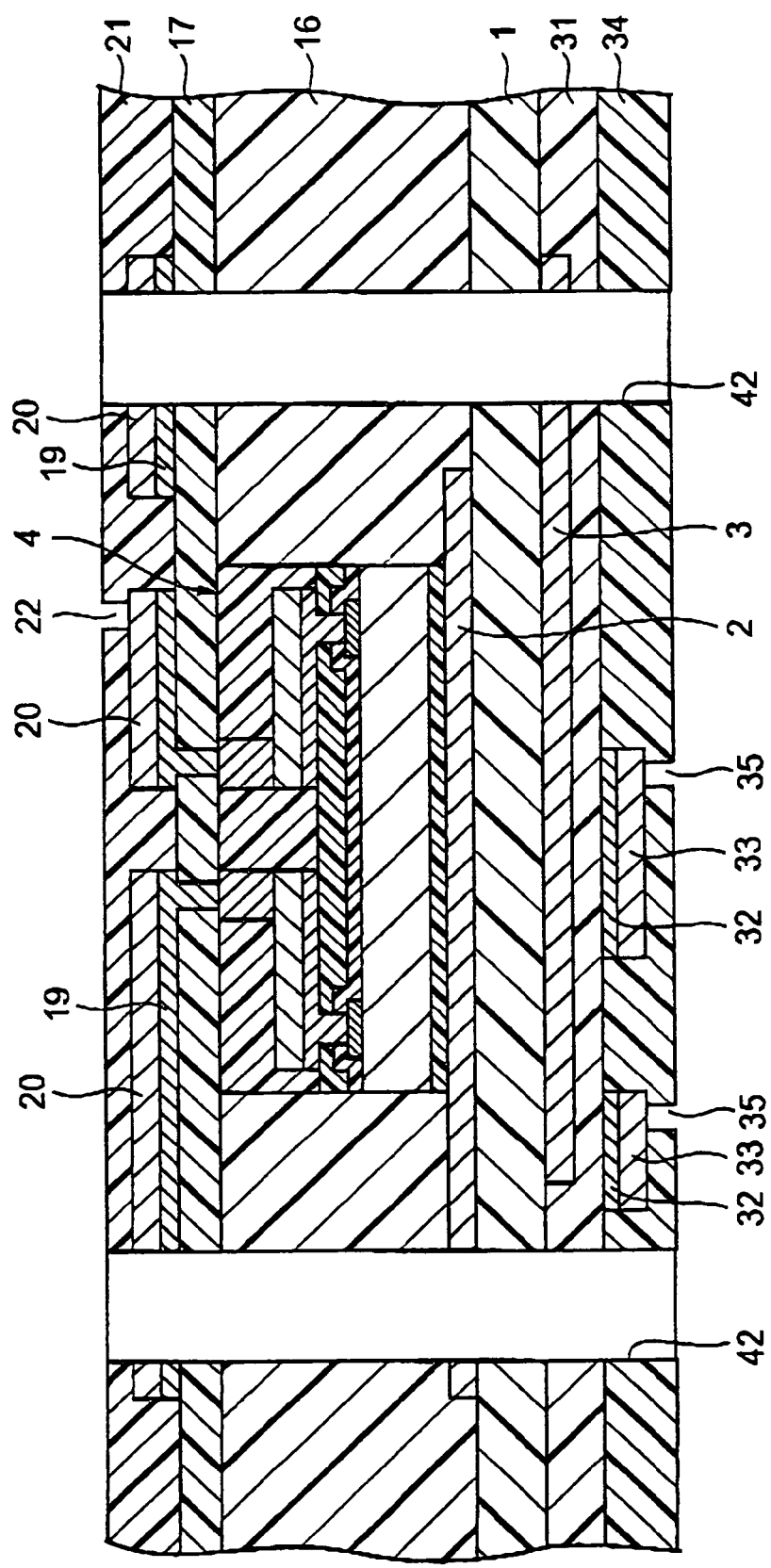
FIG. 16 is a cross-sectional view of the semiconductor device in a manufacturing step succeeding the step of FIG. 15.

As shown in FIG. 16, openings 22 are formed in the areas of the second upper insulation film 21 so as to expose at least parts of the connecting pad regions of the first upper distributing wiring layers 20 by irradiating a laser beam. Openings 35 are formed in the areas of the second lower insulation film 34 so as to expose at least parts of the connecting regions of the first lower distributing wiring layer 33.

Then, by using a mechanical drill, by irradiating a $CO_2$ laser beam, or by punching, etc., penetrating (through) holes 42 are formed in predetermined places of the second upper insulation film 21, the first upper distributing wiring layer 20 and the first upper base metal layer 19, the first upper insulation film 17, the insulation layer 16, the base plate 1, the upper layer wiring 2, the lower layer wiring 3, the first lower insulation film 31, the first lower distributing wiring layer 33 and the first lower base metal layer 32 provided at positions that are not shown in FIG. 16, and the second lower insulation film 34. Then, in accordance with necessity, epoxy smear, etc., generated in the openings 22, 35, and the penetrating hole 42 etc., is removed by desmearing processing.

Figure 17:
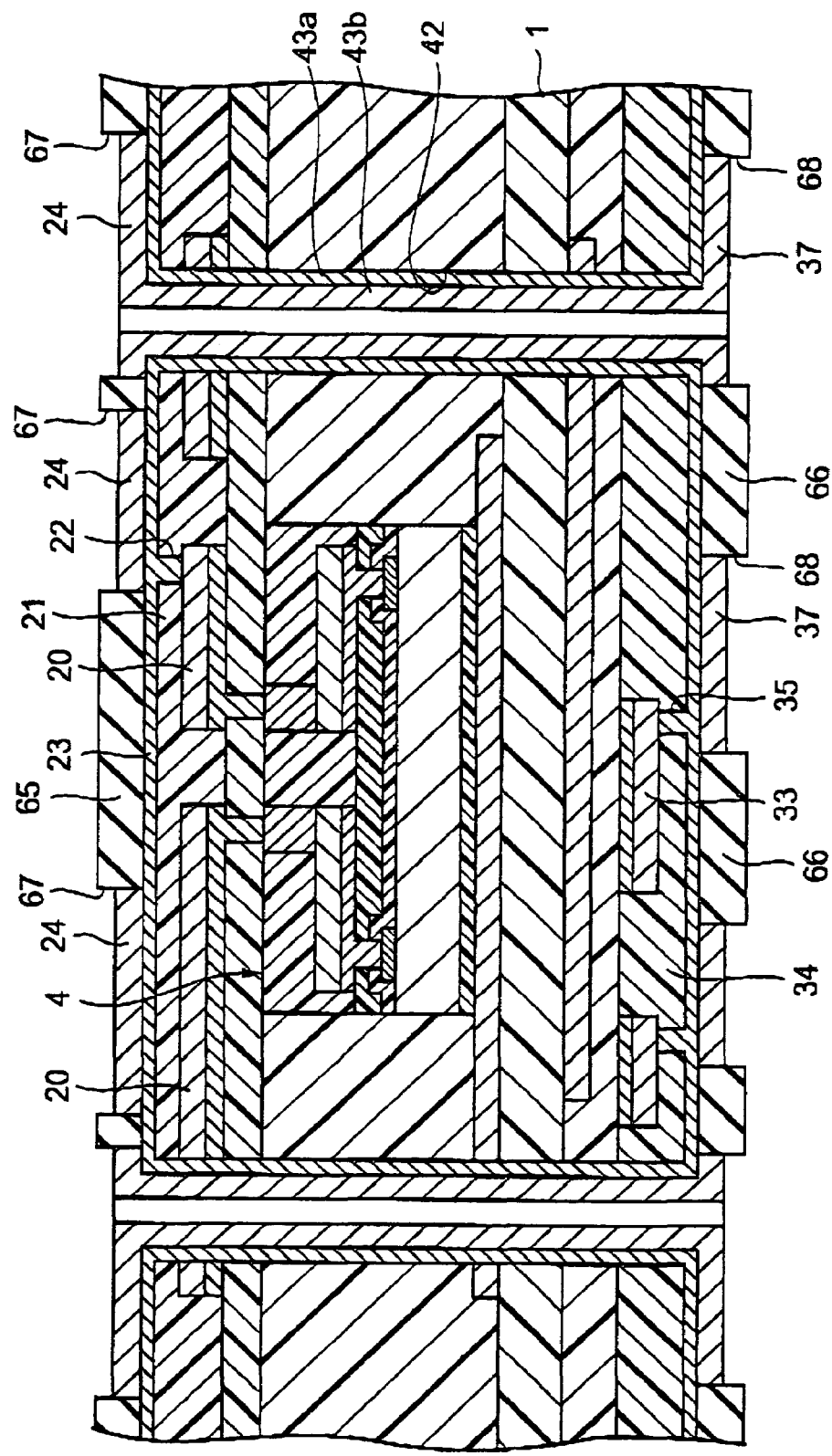
FIG. 17 is a cross-sectional view of the semiconductor device in a manufacturing step succeeding the step of FIG. 16.

As shown in FIG. 17, a metal layer is formed on the entire upper surface of the second insulation film 21, the connecting pads of the first upper distributing wiring layers 20 exposed via the openings 22, the entire lower surface of the second lower insulation films 34, the connecting pads of the first lower distributing wiring layers 33 exposed via the openings 35, and the inner wall surfaces of the penetrating holes 42, by electrolytic plating of copper, etc. The formed metal layer constitutes the second upper base metal layer 23, the second lower base metal layer 36, and the base metal layer 43a.

Then an upper plating resist film 65 is formed on the second uper base metal layer 23 and a lower plating resist film 66 is formed on the second lower base metal layer 36.

Then, the upper plating resist film 65 is patterned to form openings 67 in the upper plating resist film 65 and in areas corresponding to the penetrating holes 42 and the regions in which the second upper distributing wiring layers 24 are to be formed as shown in FIG. 17. Further, the lower plating resist film 66 is patterned to form openings 68 in the lower plating resist film 65 and in areas corresponding to the penetrating holes 42 and the regions in which the second lower distributing wiring layers 37 are to be formed in FIG. 17.

By electrolytic plating of copper using the base metal layers 23, 36, and 43a, as a plating current path, a second upper distributing wiring layer 24 is formed on the upper surface of the second upper base metal layer 23 in the opening 67 of the upper plating resist film 65, and a second lower distributing wiring layer 37 is formed on the lower surface of the second lower base metal layer 36 in the opening 68 of the lower plating resist film 66, and further, a copper layer 43b is formed on the surface of the base metal layer 43a in the penetrating hole 42.

Figure 18:
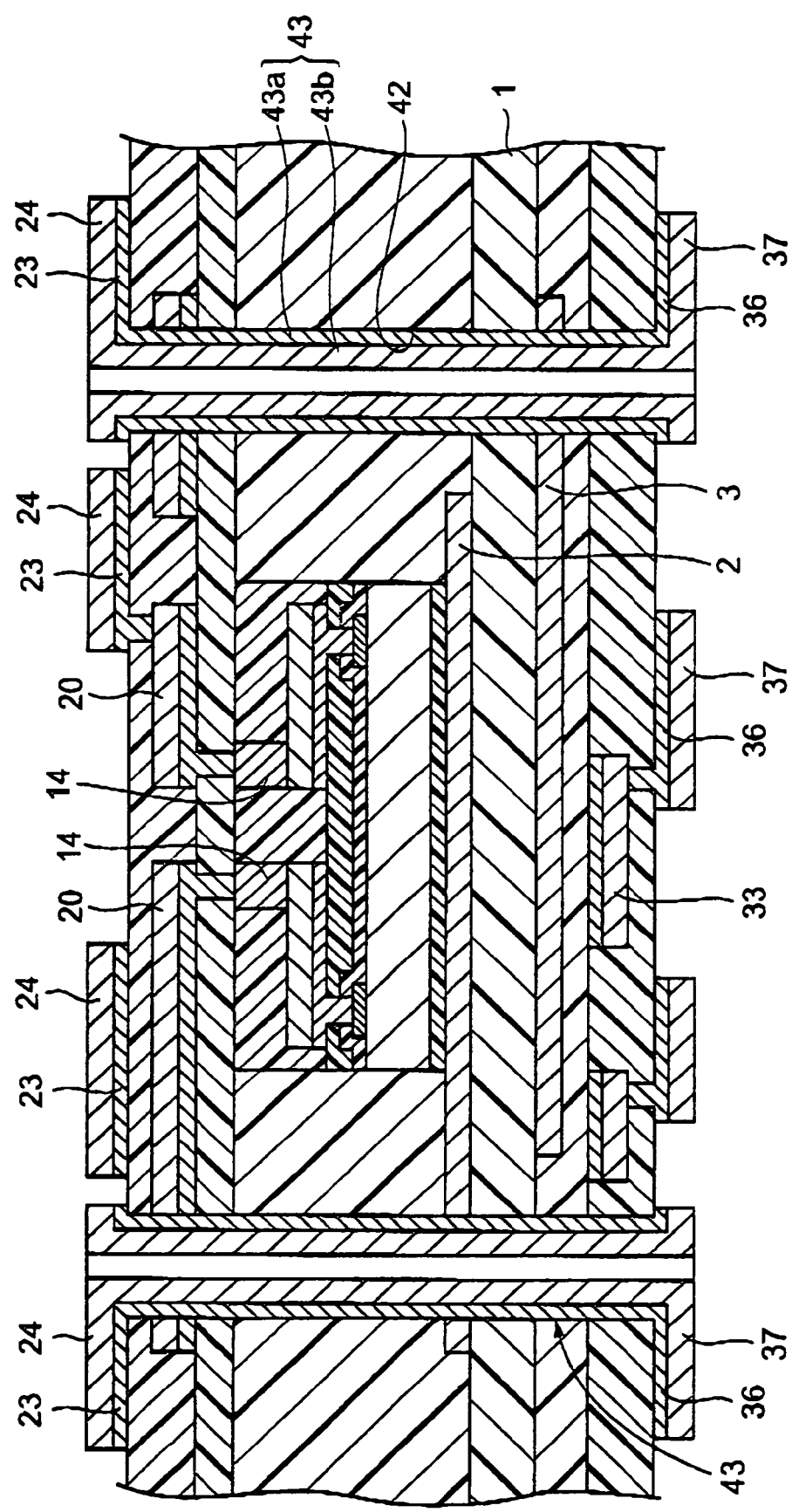
FIG. 18 is a cross-sectional view of the semiconductor device in a manufacturing step succeeding the step of FIG. 17.

Next, the plating resist films 65, 66 are removed. Then the unnecessary parts of the second upper base metal layer 23 and the second lower base metal layer 36 are removed by etching with using the second upper distributing wiring layer 24 and the second lower distributing wiring layer 37 as masks. Thereby, as shown in FIG. 18, the second upper base metal layer 23 is left only below the second upper distributing wiring layer 24, and the second lower base metal layer 26 is left only below of the second lower distributing wiring layer 37.

In this state, as one example, the columnar electrodes 14 for ground of the semiconductor element 4 is connected to the upper distributing wiring layer 2 served as the ground wiring via the first upper distributing wiring layer 20 and the vertical conductors 43. The columnar electrode 14 for power source of the semiconductor element 4 is connected to the lower distributing wiring layer 3 served as the power source wiring via the first upper distributing wiring layer 20 and the vertical conductors 43.

Figure 19:
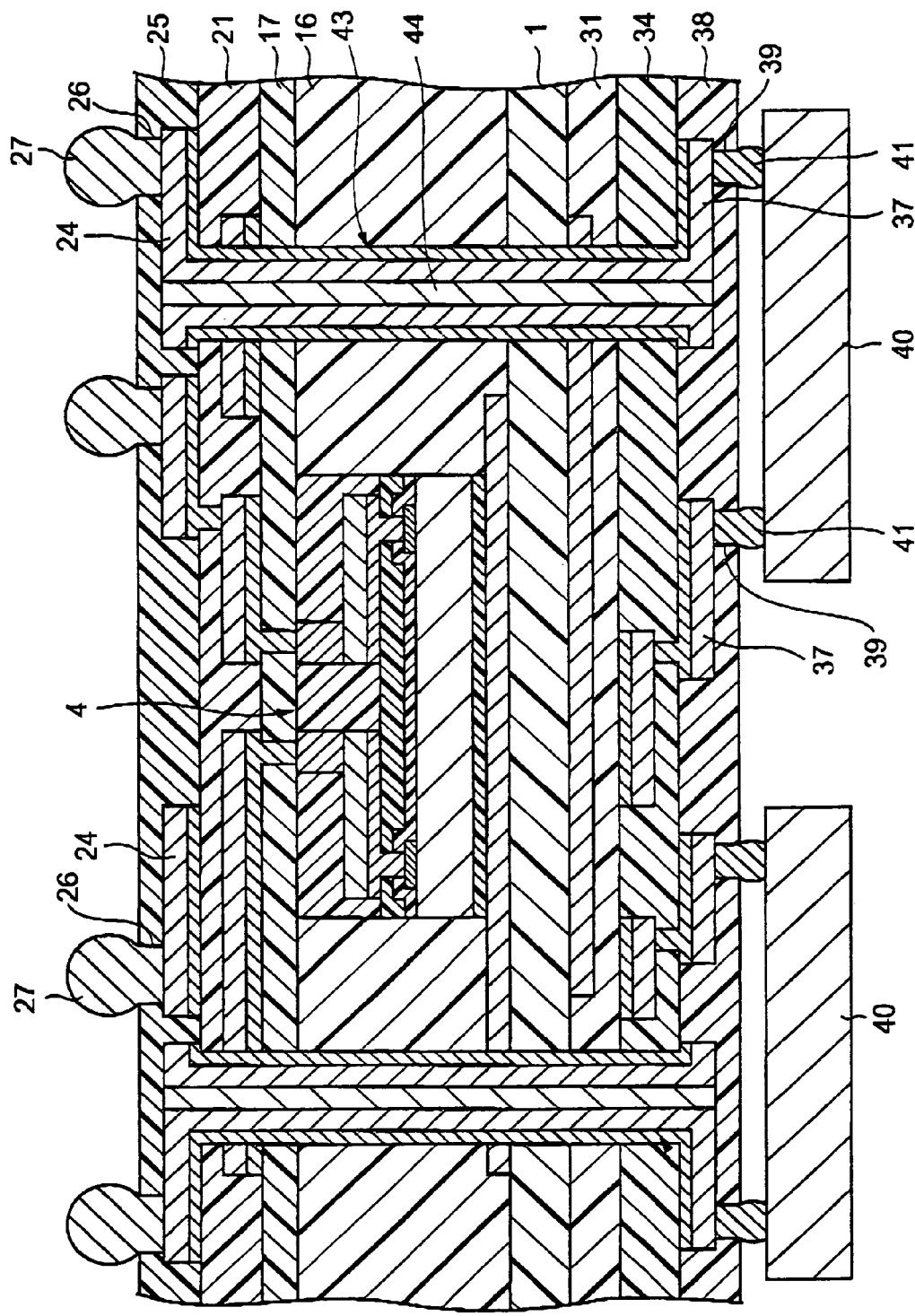
FIG. 19 is a cross-sectional view of the semiconductor device in a manufacturing step succeeding the step of FIG. 18.

As shown in FIG. 19, conductive material 44 made of copper paste, silver paste, or conductive resin, etc., is filled in the vertical conductors 43 by a screen printing, etc. Next, in accordance with need, extra conductive material 44 protruding from the penetrating hole 42 is removed by a buffing, etc.

Next, a top insulation film 25 made of solder resist, etc., is formed on the upper surface of the second upper distributing wiring layer 20 and the second upper insulation film 21 by the screen printing or the spin coating etc. In this case, openings 26 are formed in the parts of the top insulation film 25 that corresponds to the connecting pads of the second upper distributing wiring layers 24.

By the screen printing or the spin coating, etc., the bottom insulation film 38 made of solder resist, etc., is formed on the lower surface of the second lower distributing wiring layer 37 and the second lower insulation film 34. In this case, openings 39 are formed in the parts of the bottom insulation film 38 that correspond to the connecting pads of the second lower distributing wiring layers 37.

The solder balls 41 are connected to the connecting pads of the second lower distributing wiring layers 37 via the openings 39 of the bottom insulation film 38. Then the semiconductor elements 40 are mounted on the lower surface of the bottom insulation film 38. Next, the solder balls 27 are connected to the connecting pads of the second upper distributing wiring layers 24 via the openings 26.

The solder balls 41 for ground of the semiconductor element 40 is connected to the upper layer wiring 2 served as the ground wiring via the second lower distributing wiring layer 37 and the vertical conductors 43. The solder ball 41 for power source of the semiconductor element 40 is connected to the lower layer wiring 3 served as the power source wiring via the second lower distributing wiring layer 37 and the vertical conductors 43. The solder balls 41 for signal of the semiconductor elements 40 are connected to the columnar electrodes 14 for signal of the semiconductor element 4 via the first upper distributing wiring layer 20, the vertical conductors 43, the first lower distributing wiring layer 33, and the second lower distributing wiring layer 37.

Then a plurality of semiconductor devices shown in FIG. 1 are obtained by cutting (dicing) the top insulation film 25, the second upper insulation layer film 21, the first upper insulation film 17, the insulation layer 16, the base plate 1, the first lower insulation film 31, the second lower insulation film 34, and the bottom insulation film 38 between the respectively adjacent semiconductor elements 4.

According to the above mentioned manufacturing method, the manufacturing process can be simplified, because forming of the upper layer wiring 2, the lower layer wiring 3, the first and second upper distributing wiring layers 20 and 24, the first and second lower distributing wiring layers 33 and 37, the vertical conductors 43, and the solder ball 27 are carried out, to the plurality of semiconductor elements 4 placed on the base plate 1, and a plurality of semiconductor devices are obtained dicing the resultant structure thereafter, Because each insulation film and distributing wiring layer is formed so that they are stacked adhesively, compared with the conventional semiconductor device, it is possible to thin the entire thickness of the semiconductor device.

Also the manufacturing process can be simplified, because the plurality of semiconductor elements 4 can be transferred together with the base plate 1 in the steps after the step shown in FIG. 11. Further a reliability with respect to the intensity of the device can be assured compared with the method of thermo-compression, because connections between the electrode and the distributing wiring layer, and between the distributing wiring layers are formed by plating.

The columnar electrodes 14 have a height of approximately 0.1 mm. So, even in a case where stress occurs by the difference of thermal expansion of the silicon substrate 6 and the circuit substrate (not shown) due to change in environment, concentration of stress can be avoided by fluctuation of the columnar electrodes in the horizontal direction.

In the above embodiment, the upper layer wiring 2 serves as the ground winding and is formed at substantially the whole surface, and the lower layer wiring 3 serves as the power source wiring and is formed at substantially the whole surface. However, this invention is not limited to this, and the upper layer wiring 2 may serve as the power source winding and the lower layer wiring 3 may serve as the ground wiring.

Also, the upper layer wiring 2 and/or the lower wiring 3 may serve as shield layers and/or general circuit patterns. Further, the upper layer wiring 2 and/or lower layer wiring 3 may be formed on only partial areas and/or have arbitral pattern.

In the above embodiment, the CPU is formed in the silicon substrate 6 of the semiconductor element 4. However, the circuits formed in the substrate 6 are arbitral. For example, an SOI (Silicon On Insulator) including a thin film transistors formed on an insulation film may be formed in the silicon substrate 6. In this case, micro strip lines may be formed by the upper wiring 2 serving as the ground winding and formed at substantially the whole surface and the adhesive layer 5 made of conductive material.

In the above embodiment, both the upper distributing wiring layer and the lower distributing wiring layer have two layered structure. However, it is not limited to this. Each of the upper distributing wiring layer and the lower distributing wiring layer may be formed by one layer or equal to or more than three layers. Also, the numbers of layer(s) of the upper distributing wiring layer and the lower distributing wiring layer may be different from each other.

Further, a chip-part or chip-parts made of a capacitor or a resistor, etc., may be mounted on the bottom insulation film 38.

Further, in the above embodiment, the semiconductor element 4 is mounted on the base plate 1 in a face-up mounting state. However, it may be mounted in a face-down state by providing a pad unit to the base plate 1.

The semiconductor elements 40 are mounted on the second lower distributing wiring layer 37 which is the bottom layer at the lower surface side of the base plate 1. However, the semiconductor elements 40 may be mounted on the second upper distributing wiring layer 24 which is the top layer, or may be mounted on both surfaces of the second lower distributing wiring layer 37 and the second upper distributing wiring layer 24. In a case where the semiconductor elements 40 are mounted at the lower surface side of the base plate 1, it is possible that lower distributing wiring layer may be directly provided on the lower surface of the base plate 1 and the semiconductor element(s) 40 is mounted on the lower distributing wiring layer.

In the embodiment, the semiconductor elements 40 are mounted in a face-down state. However, the face-up mounting of the semiconductor elements are possible. An example thereof will be described as the second embodiment.

Second Embodiment

Figure 20:
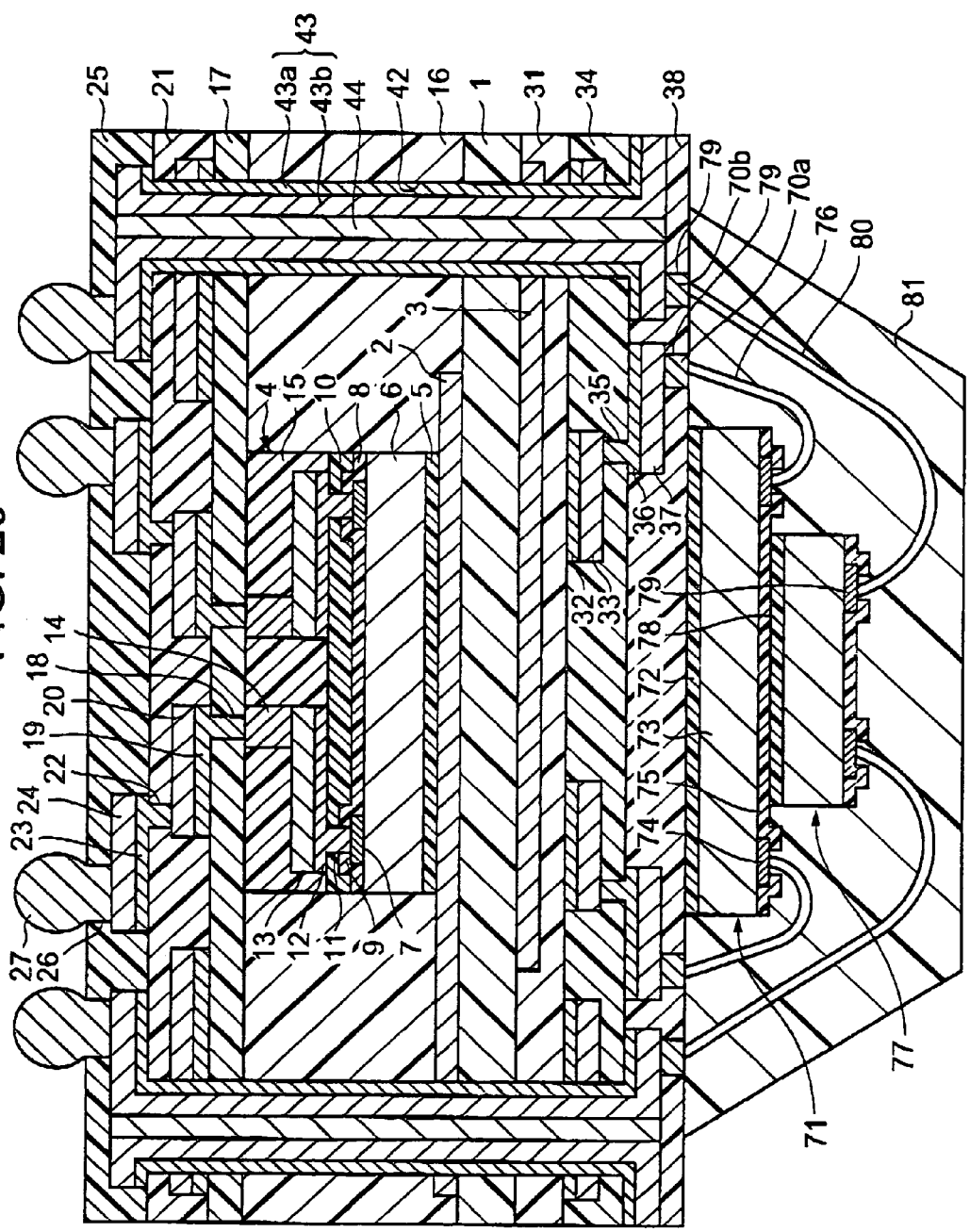
FIG. 20 is a cross-sectional view of a semiconductor device according to a second embodiment of the present invention.

In the second embodiment shown in FIG. 20, a first semiconductor element 71 and a second semiconductor element 77 mounted on the second lower distributing wiring layer 37 are face-up mounted, differed from the first embodiment shown in FIG. 1. Below the difference between the second embodiment and the first embodiment will be described mainly. The same reference numbers are used for the parts that have the same structure as the first embodiment, and the overlapping description will be omitted.

In the same way as the first embodiment, a second lower distributing wiring layer 37 that includes a second lower base metal layer 36 is formed on the lower surface of a second lower insulation film 34. However, the pattern is in accordance with the bonding positions of the later described first external semiconductor element 71 and a second external semiconductor element 77.

A bottom insulation film 38 made of solder resist, etc., is provided on the lower surface of the second lower insulation film 34 and the second lower distributing wiring layer 37. An opening 39 is provided in the part of the bottom insulation film 38 that corresponds to the connecting pad of the second lower distributing wiring layer 37. A first and second surface layers 70a and 70b made of gold are provided on the lower surfaces of the connecting pads of the second lower distributing wiring layers 37 in the openings 39. The first surface layers 70a are arranged on the peripheries of the mounting regions of the later described first external semiconductor element 71, and the second surface layers 70b are arranged on the peripheries thereof.

The lower surface of the first external semiconductor element 71 is adhered to the lower surface center portion of the bottom insulation film 38 via an adhesive layer 72 made of die bond material. The first external semiconductor element 71 is ordinarily called a bare chip. And the first external semiconductor element 71 has a silicon substrate 73 (semiconductor substrate), an integrated circuit provided on the center region of the main surface (lower surface in FIG. 20) of a silicon substrate 73, a plurality of connecting pads 74 made of aluminum metal, etc., connected to the integrated circuit, and an insulation film 75 made of oxide silicon, etc covering the connecting pads 74 excluding the center portion thereof. The connecting pads 74 of the first external semiconductor element 74 are connected to the first surface layer 70a via a first bonding wire 76.

The lower surface of a second exterior semiconductor element 77 is adhered to the lower surface center portion of the first external semiconductor element 71 via an adhesive layer 78 made of die bond material. In the same way as the first external semiconductor element 71, the second exterior semiconductor element 77 is a bare chip. The size thereof is smaller than the size of the first exterior semiconductor element 71 only to a certain extent. Because the basic structure of the second semiconductor element 77 is the same as the first exterior semiconductor element 71, the detailed description thereof will be omitted. Connecting pads 79 of the second external semiconductor element 77 are connected to the second surface layers 70b via a second bonding wire 80 made of gold. A sealing member 81 made of epoxy resin or polyimide resin, etc., covers the first and second external semiconductor elements 71 and 77, the first and second bonding wires 76 and 80, and the lower surface center portion of the bottom insulation film 38.

At least one part of the second upper distributing wiring layer 24 that includes the second upper base metal layer 23 is connected to at least one part of the second lower distributing wiring layer 37 that includes the second lower base metal layer 36 via vertical conductors 43. The vertical conductors 43 comprise a base metal layer 43a made of copper, etc., and a copper layer 43b, provided on the inner wall surface of a penetrating hole 42. The penetrating hole 42 is provided in predetermined places of, the base plate 1 that comprises the second upper insulation film 27, the first upper base metal layer 19, the first upper distributing wiring layer, the first upper insulation film 17, the insulation layer 16, and the upper distributing wiring layer or the lower distributing wiring layer 3, the first lower insulation film 31, the first lower base metal layer 32, the first lower distributing wiring layer 33, and the second lower insulation film 34.

In this case, conductive material 44 made of copper paste, silver paste, or conductive resin, etc., is filled in the vertical conductors 43 for better electric conduction of the upper and lower wiring. However, insulative resin may be filled, or the vertical conductors 43 may be hollow.

Here, as one example, the columnar electrode 14 for ground of the semiconductor element 4 is connected to the upper layer wiring 2 served as the ground wiring via the first upper distributing wiring layer 20 and the vertical conductors 43. The columnar electrode 14 for power source of the semiconductor element 4 is connected to the lower layer wiring 3 served as the power source wiring via the first upper distributing wiring layer 20 and the vertical conductors 43.

The connecting pads 74, 79 for ground of the first and second external semiconductor elements 71, 77, are connected to the upper distributing wiring layer 2 served as the ground wiring via the second lower distributing wiring layer 37 and the vertical conductors 43. The connecting pads 74, 79 for power source of the first and second external semiconductor elements 71, 77 are connected to the lower distributing wiring layer 3 served as the power source wiring via the second lower layer wiring 37 and the vertical conductors 43.

The columnar electrode 14 for signal of the semiconductor element 4 and the connecting pads 74, 79 for signal of the external semiconductor elements 71, 77 are connected via the first upper distributing wiring layer, the vertical conductors 43, the first lower distributing wiring layer 33 and the second lower distributing wiring layer 37. Then, the ground wiring is connected to the solder ball 27 for ground, the power source wiring is connected to the solder ball 27 for power source, and the signal wiring is connected to the solder 27 for signal.

The reason that the size of the base plate 1 is larger than the size of the semiconductor element 4 to a certain extent, is for making the arrangement region of the solder ball 27 larger than the size of the semiconductor element 4 to a certain extent, in accordance with the increase in number of the connecting pad 7 on the silicon substrate 6, thereby making the size and pitch of the connecting pad (interior part of the of the opening 26 of the top insulation film 25) of the second upper distributing wiring layer 24, larger than the size and pitch of the columnar electrode 14.

By this, the connecting pad of the second upper distributing wiring layer 24 arranged in a matrix is arranged at not only the region corresponding to the semiconductor element 4, but also to the region that corresponds to the insulation layer 16 provided outside of the perimeter side surface of the semiconductor element 4. Namely, of the solder balls 27 arranged in a matrix, at the least, the solder balls 27 at the most outer circumference are arranged at a periphery of a position that is outside the semiconductor element 4.

With this semiconductor device, because the first and second lower distributing wiring layers 33, 37 are provided below the base plate 1, and at least one part of the first and second upper distributing wiring layers 20, 24 and at least one part of the first and second lower distributing wiring layers 33, 37 are connected via the vertical conductors 43, the first and second external semiconductor elements 71, 77 can be mounted stacked, at the lower surface of the bottom insulation film 38. Furthermore, according to this semiconductor device, though three semiconductor elements 4, 71, and 77 are substantially stacked as a whole, because only the first and second external semiconductor elements 71 and 77 are carried out wire bonding, in a structure of stacking three semiconductor elements and carrying out wire bonding to every semiconductor element, wire bonding to the external semiconductor element at the top, can be omitted, the increase of area of the base plate 1 can be suppressed, and the value of resistance can be reduced.

Next, an example of a manufacturing of this semiconductor device will be described. The situation shown in FIG. 18, is a situation after going through the method shown in FIGS. 2 to 17, described in the first embodiment.

Figure 21:
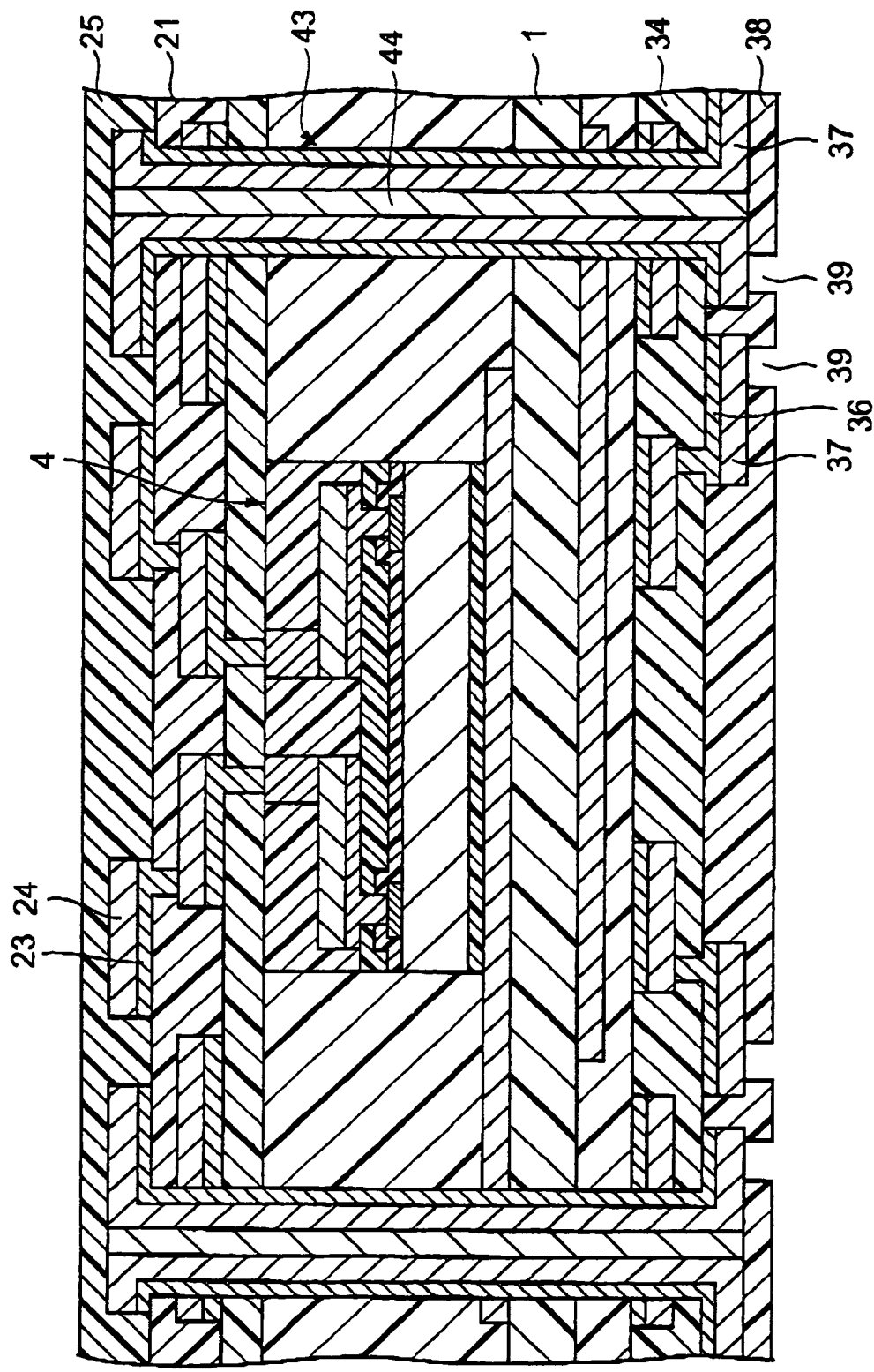
FIG. 21 is a cross-sectional view of the semiconductor device in a manufacturing step, for describing a manufacturing method of the semiconductor device shown in FIG. 20.

As shown in FIG. 21, by a screen printing etc., conductive material 44 made of copper paste, silver paste, or conductive resin, etc., is filled in the vertical conductors 43. Next, in accordance with need, extra conductive material 44 protruding from the vertical conductors 43 is removed by a buffing, etc. Next, by the screen printing or the spin coating etc., at the upper surface of the second upper insulation film 21 that includes the second upper distributing wiring layer 24, a top insulation film 25 made of solder resist, etc., is formed.

Also, by the screen printing or the spin coating etc., at the lower surface of the second lower insulation film 34 that includes the second lower distributing wiring layer 37, a bottom insulation film 38 made of solder resist, etc., is formed. In this case, at the bottom insulation film 38 of the part corresponding to the connecting pad of the second lower distributing wiring layer 37, an opening 39 is formed. At this point, an opening 26 is not formed in the part of the top insulation film 25 corresponding to the connecting pad of the second upper distributing wiring layer 24.

Here, the second upper distributing wiring layer 24 that includes the second upper base metal layer 23 is completely separated. On the other hand, the second lower distributing wiring layer 37 that includes the second lower base metal layer 36 is not completely separated, and is connected to a plating current path (not shown) formed at a later described cutting line (corresponding to dicing line) region.

Figure 22:
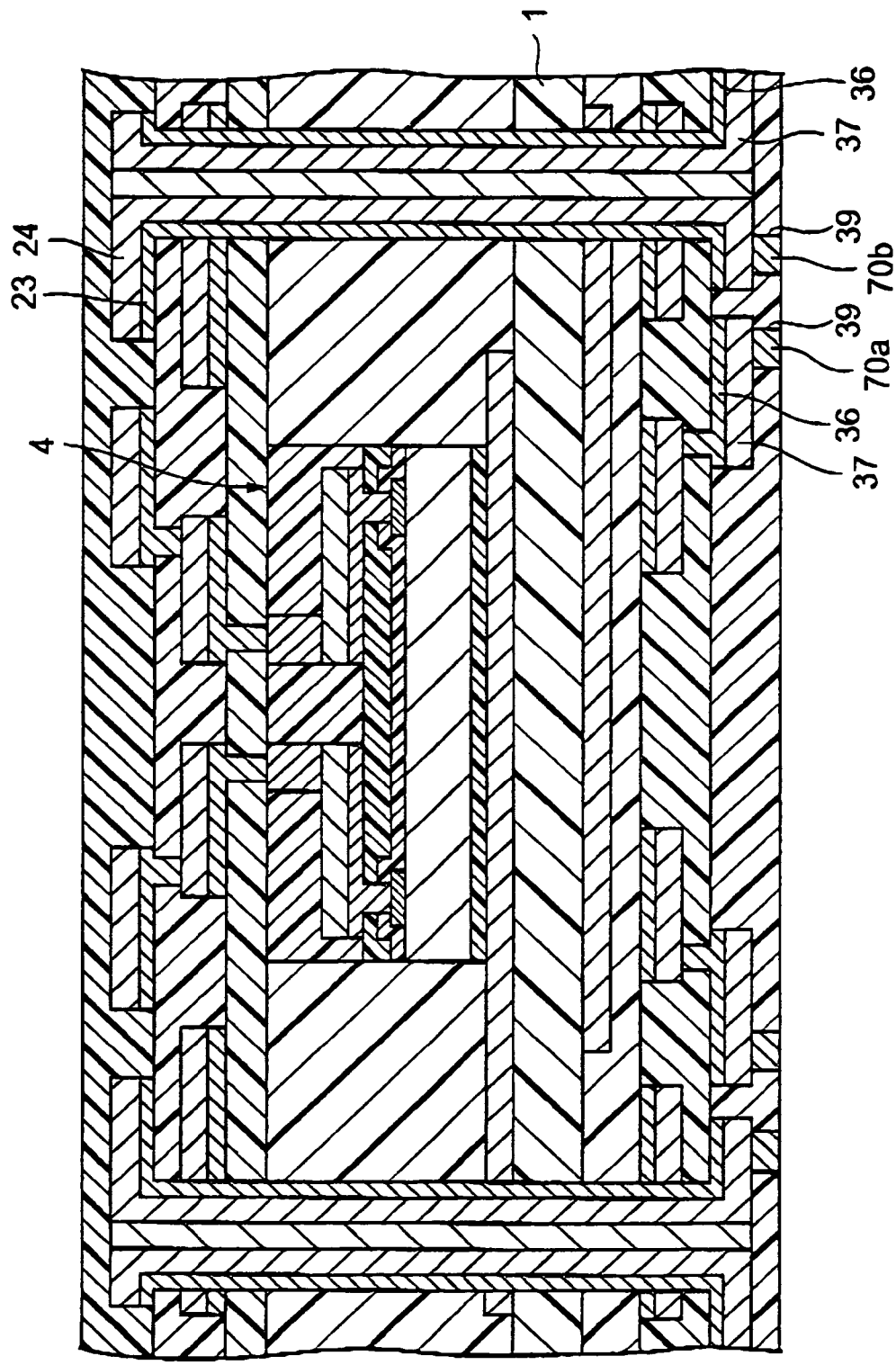
FIG. 22 is a cross-sectional view of the semiconductor device in a manufacturing step succeeding the step of FIG. 21.

As shown in FIG. 22, first and second surface layers 70a and 70b are formed by electrolytic plating of gold using the bottom insulation film 38 as the mask on the lower surface of the second lower distributing wiring layer 37 in the opening 39.

Figure 23:
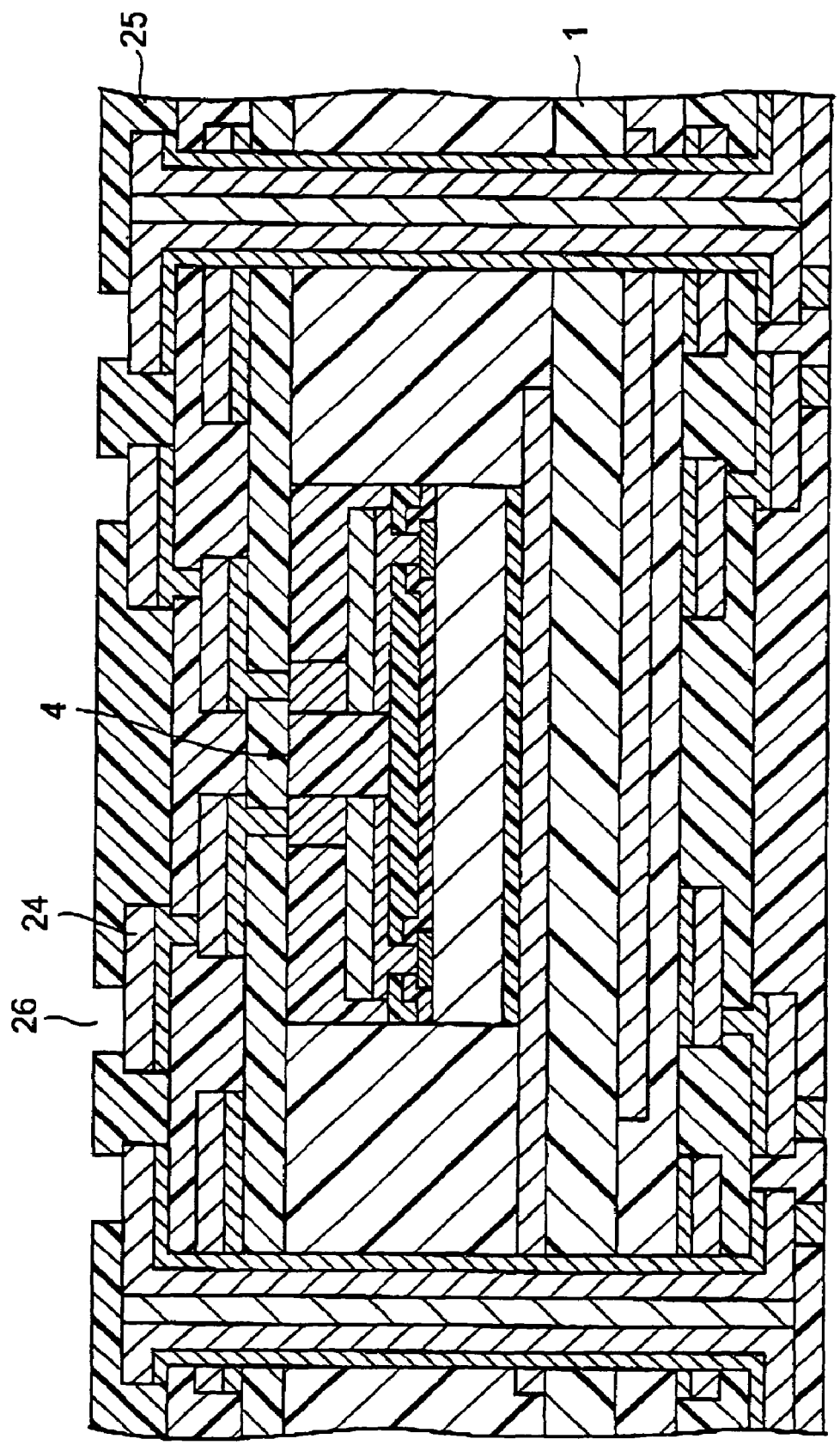
FIG. 23 is a cross-sectional view of the semiconductor device in a manufacturing step succeeding the step of FIG. 22.
Figure 24:
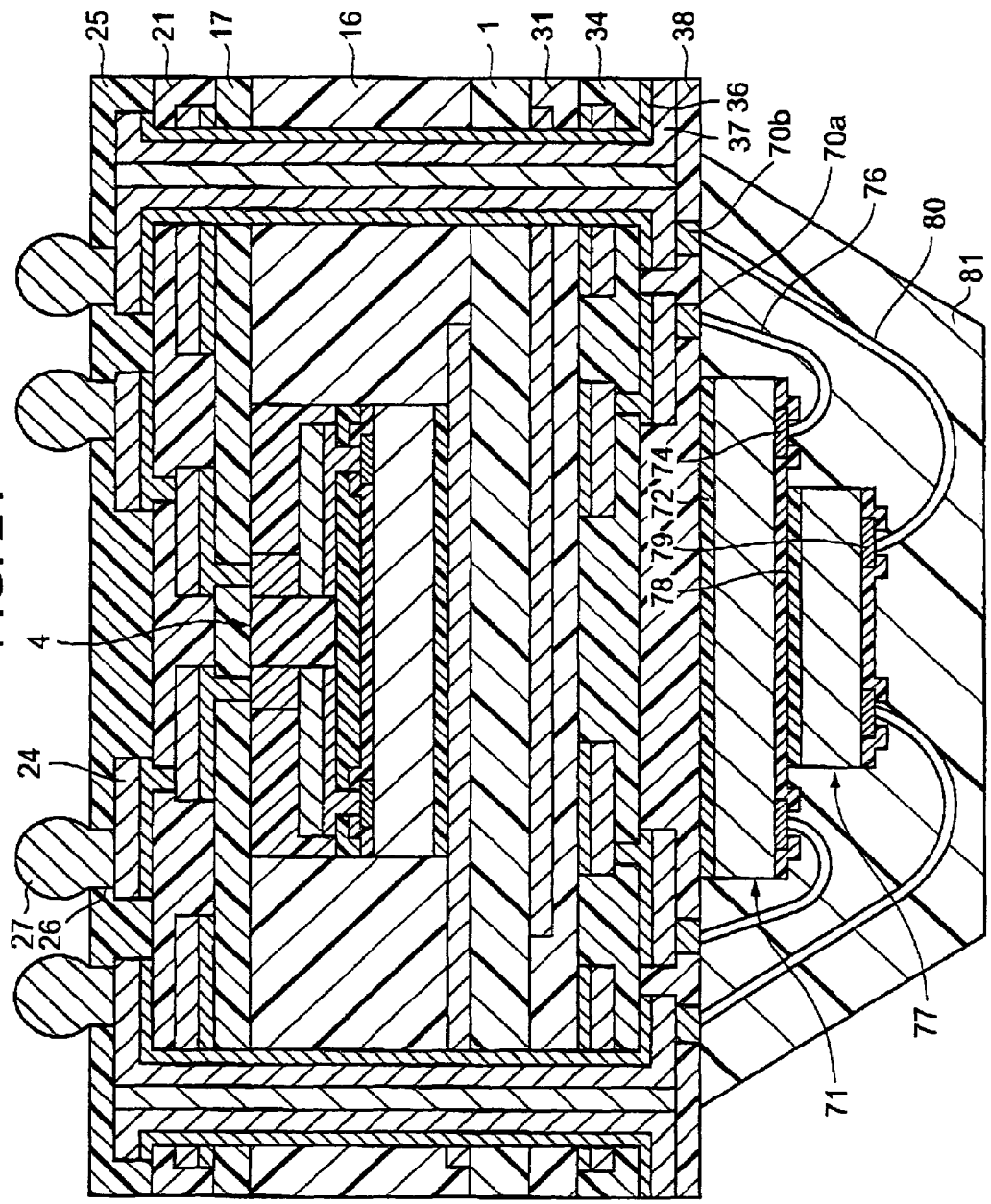
FIG. 24 is a cross-sectional view of the semiconductor device in a manufacturing step succeeding the step of FIG. 23.

Next, as shown in FIG. 23, an opening 26 is formed in the part of the top insulation film corresponding to the connecting pad of the second upper distributing wiring layer 24. Then, as shown in FIG. 24, the adhesive layer 72 of the first external semiconductor element 71 is attached to the lower surface center portion of the bottom insulation film 38, and then, the adhesive layer 78 of the second external semiconductor element 77 is connected to the lower surface center portion of the first external semiconductor element 71. Then, the connecting pads 74 of the first external semiconductor element 71 are connected to the first surface layer 70a via the first bonding wires 76 made of gold. Thereafter, the connecting pads 79 of the second external semiconductor element 77 are connected to the second surface layer 70b via the second bonding wires 80.

Or, it may be so that the adhesive layer 72 of the first external semiconductor element 71 is attached to the lower surface center portion of the bottom insulation film 38, and then, the connecting pad 74 of the first external semiconductor element 71 and the first surface layer 70a are connected via the first bonding wire 76. Thereafter, the adhesive layer 78 of the second external semiconductor element 77 is connected to the lower surface center portion of the first external semiconductor element 71, and then, connecting pad 79 of the second external semiconductor element 77 and the second surface layer 70b are connected via the second bonding wire 80.

By potting, or screen printing, etc., a sealing member 81 made of epoxy resin or polyimide resin, etc., is formed at the lower surface of the first and second external semiconductor elements 71, 77, and the bottom insulation film 38 that includes the first and second bonding wires 76 and 80. Then, a solder ball 27 is formed by connecting it to the connecting pad of the second upper re-wring, in the opening 26 and the upper side thereof. Next, a plurality of semiconductor devices shown in FIG. 20 are obtained by cutting the top insulation film 25, the second upper insulation film 21, the first upper insulation film 17, the insulation layer 16, the base plate 1, the first lower insulation film 31 the second lower insulation film 34 and the bottom insulation film 38 between the respectively adjacent semiconductor elements 4.

In this case, when cutting is carried out as the above cutting line, because the second lower distributing wiring layer 37 that includes the second lower base metal layer 36 is separated from the plating current path that is formed at the cutting line region, the second lower distributing wiring layer 37 that includes the second lower base metal layer 36 is completely separated. Here, the surface layers 70a, 70b are formed by electrolytic plating, and not by electroless plating. This is because, in a case where the surface layers 70a, 70b are formed by electroless plating, the thickness thereof is relatively thin, as to in a case where the surface layers 70a, 70b are formed by electrolytic plating, the thickness thereof becomes relatively thick. If the thickness of the surface layers 70a, 70b is relatively thin, it is more likely for a defect of connection by wire bonding to occur. On the other hand, if the thickness of the surface of the layers 70a, 70b is relatively thick, it is most likely for a defect of connection by wire bonding, not to occur.

Third Embodiment

Figure 25:
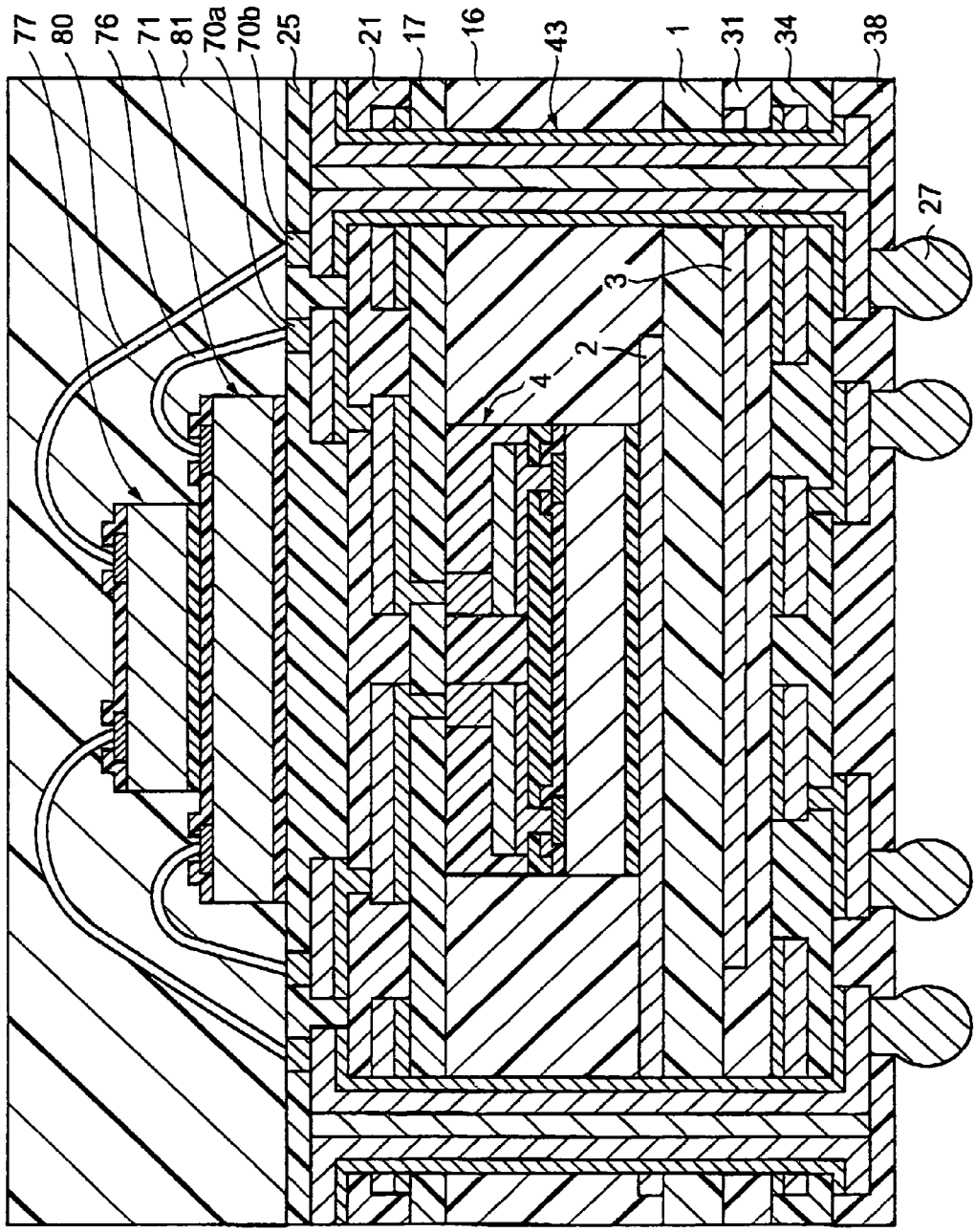
FIG. 25 is a cross-sectional view of a semiconductor device according to a third embodiment of the present invention.

FIG. 25 is a cross-sectional view of a semiconductor device as a third embodiment of the invention. The point that the semiconductor device shown in FIG. 25 mainly differs from the semiconductor device shown in FIG. 20, is that the first and second external semiconductor elements 71, 77 are provided stacked on the top insulation film 25, and the solder ball 27 is arranged below the bottom insulation film 38. In this case, the first and second external semiconductor elements 71, 77, and the seal member 81 that covers the second bonding wires 76, 80, are formed by a transfer mold method, etc., and when each semiconductor element is obtained by cutting, the sealing member 81 is also cut.

Fourth Embodiment

Figure 26:
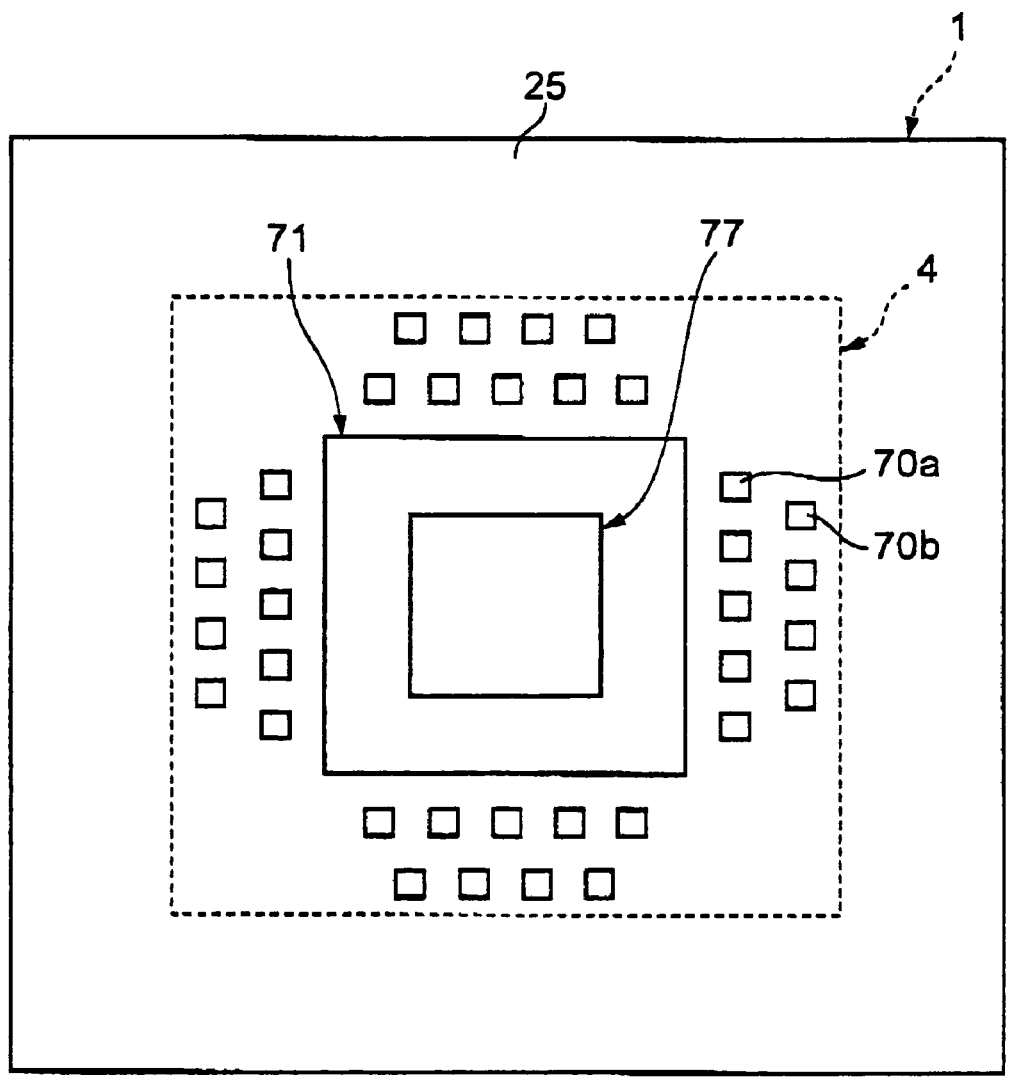
FIG. 26 is a cross-sectional view of a semiconductor device according to a fourth embodiment of the present invention.

FIG. 26 is a plane view showing the substantial parts (for example, a semiconductor device in a state where the sealing member 81, the first and second bonding wires 76, 80, etc. are omitted), of a semiconductor device, as a fourth embodiment of the invention. Because a top insulation film 25, etc., exists between the semiconductor element 4 and the first external semiconductor element 71, in this semiconductor device, a semiconductor element with a large exterior size is used to provide first and second surface layers 70a, 70b which are connected via the connecting pads of the first and second external semiconductor elements 71, 77 (not shown), and the first and second bonding wires (not shown), on the top insulation film 25 that corresponds to the region in the semiconductor element 4.

In a case where the first and second external semiconductor elements 71, 77 are directly stacked on the semiconductor element 4 provided on the base plate 1, a connecting pad that is connected via three semiconductor elements 4, 71, and 77, and the bonding wire, is provided at the out side of the mounting region of the semiconductor element 4, on the base plate 1, therefore, the size of the base plate 1 becomes quite large. On the other hand, with the semiconductor device shown in FIG. 26, as described above, because the first and second surface layers 70a, 70b that are connected via the connecting pads of the first and second external semiconductor elements 71, 77, and the first and second bonding wires, are provided on the top insulation film 25 that corresponds to the region in the semiconductor element 4, the size of the base plate 1 can be made quite small.

Fifth Embodiment

Figure 27:
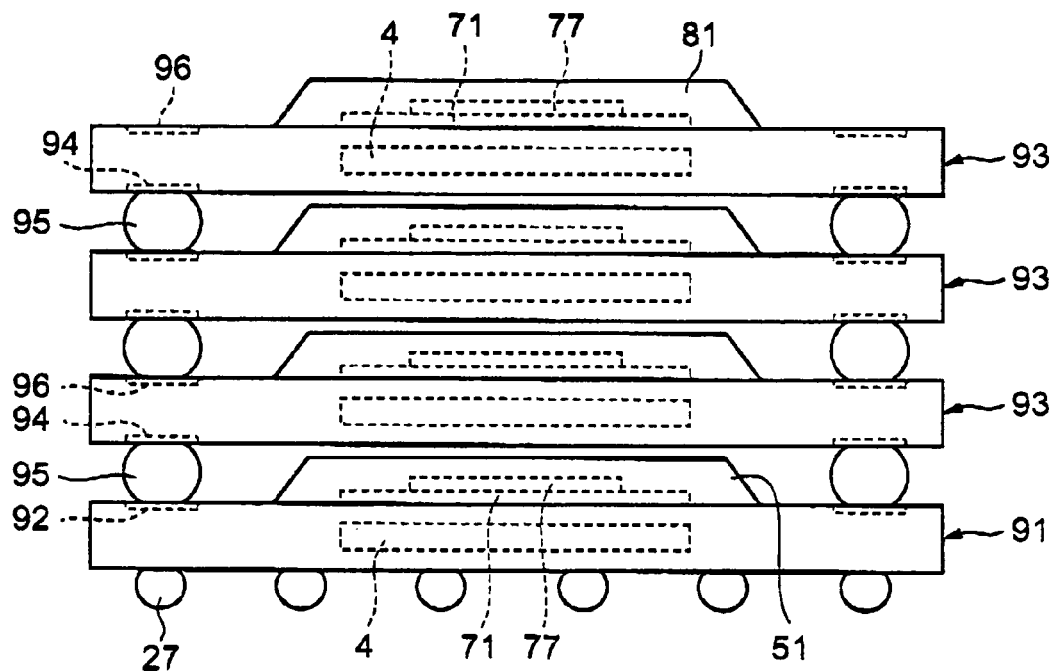
FIG. 27 is a cross-sectional view of a semiconductor device according to a fifth embodiment of the present invention.

FIG. 27 is a front view of a semiconductor device as a fifth embodiment of the invention. Within this semiconductor device, a plurality of semiconductor blocks, for example four semiconductor blocks, that correspond to the semiconductor device shown in FIG. 20, are stacked. In this case, a semiconductor block 91 of the bottom layer is basically the same as the semiconductor device shown in FIG. 20. However, the size of the semiconductor block 91 is a little larger than the semiconductor device shown in FIG. 20, and at the periphery of the sealing member 81, an upper connecting pad 92 is provided, on the upper surface of the semiconductor block 91. Another semiconductor block 93 is basically the same as the semiconductor block 91 at the bottom layer. However, the semiconductor block 93 does not comprise a solder ball 27. Instead, a solder ball 95 is provided below a lower connecting pad 94 that is provided at the region corresponding to the periphery of the sealing member 81, at the lower surface of the semiconductor block 93. At the upper surface of the semiconductor block 93, an upper connecting pad 96 is provided at the periphery of the sealing member 81.

Here, the upper connecting pads 92, 96 are formed by a part of the connecting pad of the second lower distributing wiring layer 37, shown in FIG. 20. In this case, a surface layer may be formed in the opening 39 of the bottom insulation film 38 for exposing the connecting pad of the second lower distributing wiring layer 37. The lower connecting unit 94 is formed of the connecting pad of the second upper distributing wiring layer 24 shown in FIG. 2. In this case, the connecting pad of the second upper distributing wiring layer for forming the lower connecting 94 is provided only at the region corresponding to the periphery of the sealing member 81.

The semiconductor block 93 of the second layer is mounted on the bottom layer semiconductor block 91, by the solder ball 95 of the semiconductor block 93 being attached to the upper connecting pad 92 of the bottom layer semiconductor block 91. The semiconductor blocks 93 of the third layer and fourth layer are mounted on the semiconductor block 93 of the second layer and the third layer, by the solder balls 95 of the third layer and fourth layer being attached to the upper connecting pad 96 of the semiconductor block 93 of the second layer and the third layer. In a case where the thickness of the sealing member 81 is 0.5 to 0.6 mm, a solder ball 95 with a diameter of 0.8 to 1.0 mm is used.

In each embodiment of above, a case where two external semiconductor elements are stacked and mounted is described. However, it is not limited to this, and a case where one external semiconductor element is mounted, or three or more external semiconductor elements are stacked and mounted, is possible. In the above embodiment, a case where both the upper distributing wiring layer and the lower distributing wiring layer have two layers is described. It is not limited to this, and the upper distributing wiring layer and lower distributing wiring layer may have one layer or three or more layers, and also, the number of layers do not have to be equal, and may be a different number of layers. However, in a case where the number of layers is the same, bowing of the semiconductor can be reduced.

In the above embodiment, respectively adjacent semiconductor elements 4 are cut. However, it is not limited to this, and two or more semiconductor elements 4 may be cut, as one pair. In this case, a plurality of external semiconductor elements may be stacked to each semiconductor element 4. The semiconductor element that is one pair by a plurality of semiconductor elements 4 may be the same type, or a different type.

In the above embodiment, the semiconductor element 4 comprises a columnar electrode 14 as an electrode for external connection. However, it is not limited to this, and the semiconductor element 4 may comprise a distributing wiring layer 13 that includes a connecting pad as the electrode for external connection, instead of comprising the columnar electrode. Or, the semiconductor element 4 may be a semiconductor element that comprises a connecting pad 7 as the electrode for external connection (namely, a bare chip), instead of comprising a columnar electrode or a distributing wiring layer.

In the present invention, a first semiconductor element that comprises a plurality of electrodes for external connection is in a sealed state, by mounting the first semiconductor element on a base plate, and covering the periphery thereof by an insulation material, and the upper surface thereof by an upper insulation film. A second semiconductor element is connected to at least either an upper distributing wiring layer, which is provided on the upper insulation film, or a lower distributing wiring layer, which is provided directly on the base plate, or via the lower insulation film. By adopting this kind of structure, the present invention can provide a semiconductor device and a manufacturing method of the semiconductor device, wherein further thinning can be carried out while maintaining a small mounting surface, and securing reliability of the strength of the connecting unit.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Applications No. 2003-379547 filed on Nov. 10, 2003 and No. 2003-395313 filed on Nov. 26, 2003 and including specification, claims, drawings and summary. The disclosure of the above Japanese Patent applications is incorporated herein by reference in their entirety.

What is claimed is:

1. A semiconductor device comprising:
   a first semiconductor element that includes: a semiconductor substrate, a plurality of connecting pads, a plurality of columnar electrodes for external connection which are connected to the connecting pads, and a sealing film covering the semiconductor substrate between the columnar electrodes such that an upper surface of the sealing film is flush with upper surfaces of the columnar electrodes;

an insulation member provided at a periphery of the first semiconductor element;

an upper wiring structure formed on an upper surface of the first semiconductor element and the insulation member;

a lower wiring structure formed on a lower surface of the first semiconductor element and the insulation member; and a second semiconductor element that is mounted on at least one of the upper wiring structure and the lower wiring structure;

wherein the first semiconductor element comprises an overcoat covering the semiconductor substrate except for a center of each of the connecting pads and wirings which are formed on the overcoat and which connect the connecting pads to the columnar electrodes, respectively.

2. The semiconductor device according to claim 1, further comprising a conductor that penetrates the insulation member to electrically connect the upper wiring structure and the lower wiring structure.

3. The semiconductor device according to claim 1, wherein the second semiconductor element is mounted only on one of the upper wiring structure and the lower wiring structure, and solder balls are mounted on the other of the upper wiring structure and the lower wiring structure.

4. The semiconductor device according to claim 1, wherein the upper wiring structure comprises upper insulation films having a multiple-layer structure, and upper wiring layers having a multiple-layer structure.

5. The semiconductor device according to claim 4, wherein a top layer of the upper wiring layers includes at least one connecting pad, and the upper layer wiring structure includes a top insulation film that covers the top layer of the upper wiring layers except for the connecting pad.

6. The semiconductor device according to claim 5, further comprising at least one solder ball provided on the at least one connecting pad of the top layer of the upper wiring layers.

7. The semiconductor device according to claim 5, further comprising surface layers provided on the top layer of the upper wiring layers.

8. The semiconductor device according to claim 7, wherein the second semiconductor element is mounted on the top insulation film.

9. The semiconductor device according to claim 7, wherein the second semiconductor element comprises bonding wires connected to the surface layers.

10. The semiconductor device according to claim 1, wherein the lower wiring structure comprises a base plate, a lower insulation film, and a lower wiring layer.

11. The semiconductor device according to claim 10, wherein the base plate comprises at least one of an upper layer wiring provided on an upper surface of the base plate and a lower layer wiring provided on a lower surface of the base plate.

12. The semiconductor device according to claim 11, wherein at least one of the upper layer wiring and the lower layer wiring is a ground wiring.

13. The semiconductor device according to claim 10, wherein the base plate is made of thermosetting resin including a reinforcer.

14. The semiconductor device according to claim 1, wherein the lower wiring structure includes lower insulation films having a multiple-layer structure, and lower wiring layers having a multiple-layer structure.

15. The semiconductor device according to claim 14, wherein a bottom layer of the lower wiring layers includes at least one connecting pad, and the lower wiring structure includes a bottom insulation film that covers the bottom layer of the lower wiring layers except for the at least one connecting pad.

16. The semiconductor device according to claim 15, further comprising a solder ball intervened between the second semiconductor element and the bottom layer of the lower wiring layers.

17. The semiconductor device according to claim 15, further comprising surface layers provided on the bottom layer of the lower wiring layers.

18. The semiconductor device according to claim 17, wherein the second semiconductor element is mounted on the bottom insulation film.

19. The semiconductor device according to claim 18, wherein the second semiconductor element comprises bonding wires that are connected to the surface layers.

20. The semiconductor device according to claim 1, wherein each of the columnar electrodes has a height of at least 60 µm.

* * * * *